(12) United States Patent
Sasaki et al.

(10) Patent No.: US 8,450,220 B2
(45) Date of Patent: May 28, 2013

(54) SUBSTRATE PROCESSING APPARATUS, METHOD OF MANUFACTURING SEMICONDUCTOR DEVICE, AND METHOD OF MANUFACTURING SUBSTRATE

(75) Inventors: Takafumi Sasaki, Toyama (JP); Sadao Nakashima, Toyama (JP); Yoshinori Imai, Nanto (JP); Koei Kuribayashi, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/825,005

(22) Filed: Jun. 28, 2010

(65) Prior Publication Data

US 2010/0330781 A1 Dec. 30, 2010

(30) Foreign Application Priority Data

Jun. 30, 2009 (JP) ................................. 2009-156319
May 18, 2010 (JP) ................................. 2010-114591

(51) Int. Cl.
*H01L 21/469* (2006.01)
(52) U.S. Cl.
USPC ........................................................ 438/785
(58) Field of Classification Search
None
See application file for complete search history.

(56) References Cited

U.S. PATENT DOCUMENTS

| 6,449,871 B1* | 9/2002 | Kholodenko et al. | 34/255 |
| 2004/0026037 A1* | 2/2004 | Shinriki et al. | 156/345.33 |
| 2009/0304924 A1* | 12/2009 | Gadgil | 427/255.5 |
| 2010/0326358 A1* | 12/2010 | Choi | 118/725 |

FOREIGN PATENT DOCUMENTS

| JP | 2004-006551 | 1/2004 |
| JP | 2006-196807 | 7/2006 |
| WO | WO 2007/108401 | 9/2007 |

* cited by examiner

*Primary Examiner* — Charles Garber
*Assistant Examiner* — Andre' C Stevenson
(74) *Attorney, Agent, or Firm* — Brundidge & Stanger, P.C.

(57) ABSTRACT

There are provided a substrate processing apparatus, a method of manufacturing a semiconductor device, and a method of manufacturing a substrate, for growing a SiC epitaxial film at a high-temperature condition. The substrate processing apparatus comprises: a reaction chamber; a first gas supply system configured to supply at least a gas containing silicon atoms and a gas containing chlorine atoms, or a gas containing silicon and chlorine atoms; a second gas supply system configured to supply at least a reducing gas; a third gas supply system configured to supply at least a gas containing carbon atoms; a first gas supply nozzle connected to the first gas supply system or the first and third gas supply systems; a second gas supply nozzle connected to the second gas supply system or the second and third gas supply systems; and a controller configured to control the first to third gas supply systems.

20 Claims, 20 Drawing Sheets

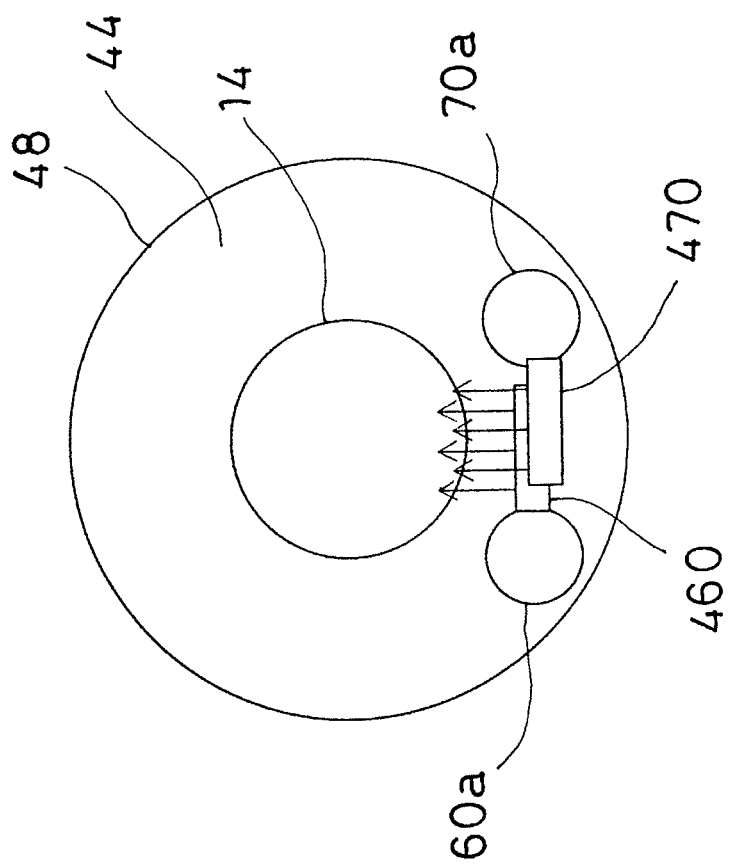

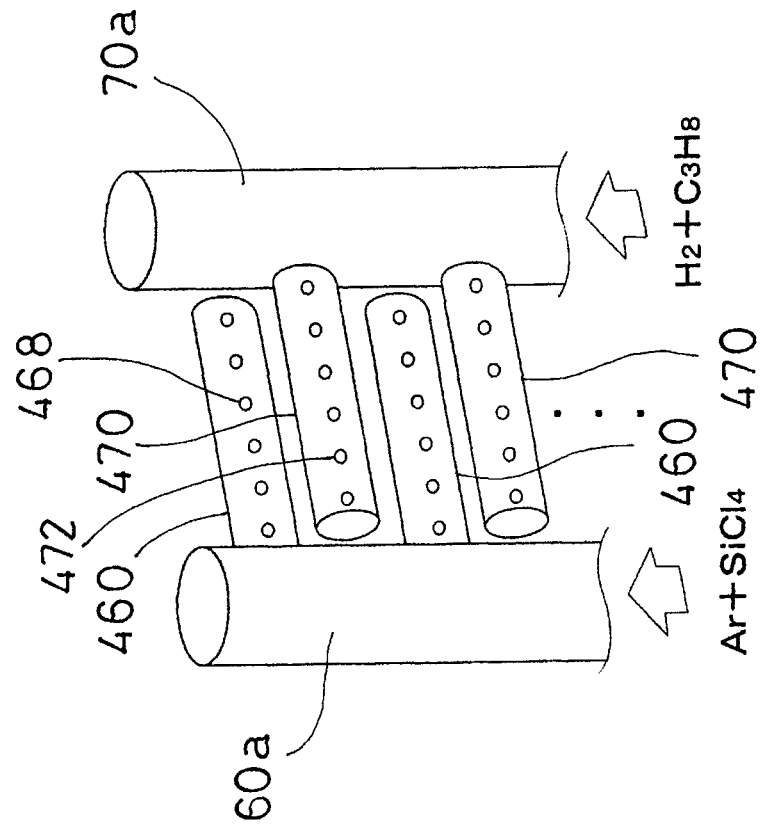

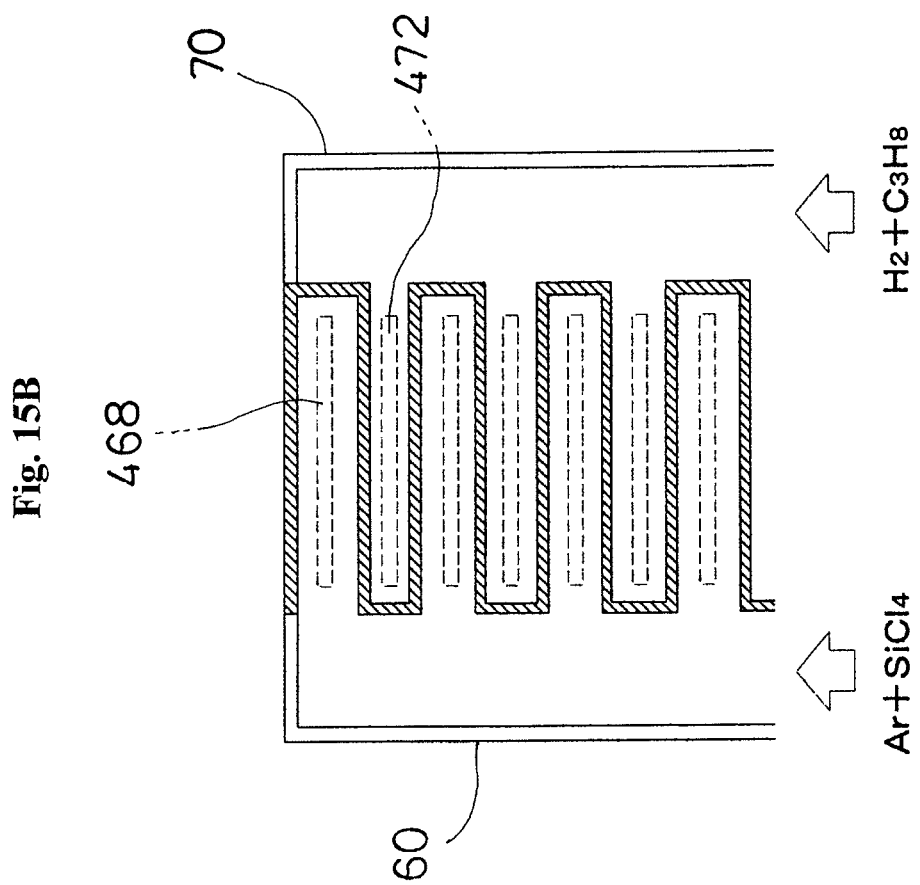

SUBSTRATE PROCESSING APPARATUS, METHOD OF MANUFACTURING SEMICONDUCTOR DEVICE, AND METHOD OF MANUFACTURING SUBSTRATE

CROSS-REFERENCE TO RELATED PATENT APPLICATION

This U.S. non-provisional patent application claims priority under 35 U.S.C. §119 of Japanese Patent Application Nos. 2009-156319, filed on Jun. 30, 2009, and 2010-114591, filed on May 18, 2010, in the Japanese Patent Office, the entire contents of which are hereby incorporated by reference.

BACKGROUND OF THE INVENTION

1. Field of the Invention

The present invention relates to a substrate processing apparatus, a method of manufacturing a semiconductor device, and a method of manufacturing a substrate, which include a process of treating a substrate. More particular, the present invention relates to a substrate processing apparatus, a method of manufacturing a semiconductor device, and a method of manufacturing a substrate, which include a process of forming a silicon carbide (hereinafter referred to as SiC) epitaxial film on a substrate.

2. Description of the Related Art

SiC attracts attention as a material particularly for elements of a power device. However, it is known that it is difficult to make a crystalline substrate or device by using SiC as compared with the case of using silicon (hereinafter referred to as Si).

In a SiC film forming apparatus of the related art, a plurality of substrates are disposed on a plane of a plate-shaped susceptor and are heated to 1500° C. to 1800° C., and a filming forming source gas is supplied into a reaction chamber from one spot to form SiC epitaxial films on the top surfaces (main surfaces) of the substrates.

However, there are several problems in the related art. For example, in the case where a plurality of substrates are processed or substrates having a large diameter are processed as shown in FIG. 16, a susceptor having a large size and a reaction chamber having a large floor area are necessary. In addition, since a source gas is supplied into the reaction chamber through one spot, the concentration of the gas is not uniform throughout the reaction chamber, and thus the thickness of films formed on the substrates are not uniform. Furthermore, when SiC epitaxial films are grown, since the process temperature is high in the range from 1500° C. to 1800° C., it is difficult to control the in-surface temperature of wafers.

Patent Document 1 discloses a vacuum film forming apparatus and a thin film forming method, in which a susceptor is disposed in a manner such that a substrate holding surface of the susceptor faces downward so as to solve problems, such as adhesion of matters deposited from a source gas to a surface facing the susceptor, and unstable epitaxial growth of SiC caused by a convection flow of a source gas.

[Patent Document]

Japanese Unexamined Patent Application Publication No. 2006-196807

SUMMARY OF THE INVENTION

An object of the present invention is to provide a substrate processing apparatus, a method of manufacturing a semiconductor device, and a method of manufacturing a substrate, for uniformly forming films on a plurality of substrates in a SiC epitaxial film growing process performed at a high temperature.

According to an aspect of the present invention, there is provided a substrate processing apparatus comprising: a reaction chamber configured to process a plurality of substrates stacked at predetermined intervals; a magnetic field generating unit installed outside the reaction tube and generating a magnetic field; a heating target object installed between the reaction tube and the magnetic field generating unit, the heating target object being configured to heat an inside of the reaction chamber by the magnetic field generated by the magnetic field generating unit; a first gas supply system configured to supply at least a gas containing silicon atoms and a gas containing chlorine atoms, or a gas containing silicon atoms and chlorine atoms; a second gas supply system configured to supply at least a reducing gas; a third gas supply system configured to supply at least a gas containing carbon atoms; a first gas supply nozzle connected to the first gas supply system and extending within the reaction chamber in a stacked direction of the plurality of substrates, the first gas supply nozzle comprising one or more first gas supply inlets in a region where the plurality of substrates are stacked; a second gas supply nozzle connected to the second and third gas supply systems and extending within the reaction chamber in the stacked direction, the second gas supply nozzle comprising one or more second gas supply inlets in the region where the plurality of substrates are stacked; and a controller configured to control: the first gas supply system to supply at least the gas containing silicon atoms and the gas containing chlorine atoms, or at least the gas containing silicon atoms and chlorine atoms into the reaction chamber through the first gas supply inlets of the first gas supply nozzle; the second gas supply system to supply at least the reducing gas into the reaction chamber through the second gas supply inlets of the second gas supply nozzle; and the third gas supply system so as to supply at least the gas containing carbon atoms into the reaction chamber through the second gas supply inlets of the second gas supply nozzle, so as to form silicon carbide films on the substrates.

According to another aspect of the present invention, there is provided a method of manufacturing a semiconductor device, the method comprising:

loading a plurality of substrates stacked at predetermined intervals into a reaction chamber;

heating an inside of the reaction chamber by a heating target object installed between the reaction tube and a magnetic field generating unit with a magnetic field generated by the magnetic field generating unit installed outside the reaction tube;

forming silicon carbide films on the plurality of substrates by supplying at least a gas containing silicon atoms and a gas containing chlorine atoms, or at least a gas containing silicon atoms and chlorine atoms into the reaction chamber through one or more first gas supply inlets of a first gas supply nozzle extending within the reaction chamber in a stacked direction of the plurality of substrates, the one or more first gas supply inlets being disposed in a region where the plurality of substrates are stacked, and supplying at least a reducing gas and a gas containing carbon atoms into the reaction chamber through one or more second gas supply inlets of a second gas supply nozzle extending within the reaction chamber in the stacked direction, the one or more second gas supply inlets being disposed in the region where the plurality of substrates are stacked; and unloading the plurality of substrates from the reaction chamber.

According to another aspect of the present invention, there is provided a method of manufacturing a substrate, the method comprising:

loading a plurality of substrates stacked at predetermined intervals into a reaction chamber;

heating an inside of the reaction chamber by a heating target object installed between the reaction tube and a magnetic field generating unit with a magnetic field generated by the magnetic field generating unit installed outside the reaction tube;

forming silicon carbide films on the plurality of substrates by supplying at least a gas containing silicon atoms and a gas containing chlorine atoms, or at least a gas containing silicon atoms and chlorine atoms into the reaction chamber through one or more first gas supply inlets of a first gas supply nozzle extending within the reaction chamber in a stacked direction of the plurality of substrates, the one or more first gas supply inlets being disposed in a region where the plurality of substrates are stacked, and supplying at least a reducing gas and a gas containing carbon atoms into the reaction chamber through one or more second gas supply inlets of a second gas supply nozzle extending within the reaction chamber in the stacked direction, the one or more second gas supply inlets being disposed in the region where the plurality of substrates are stacked; and unloading the plurality of substrates from the reaction chamber.

BRIEF DESCRIPTION OF THE DRAWINGS

FIG. 14A and FIG. 14B are views illustrating a process furnace according to a third embodiment of the present invention, in which FIG. 14A is a cross-sectional view of the process furnace and FIG. 14B is a partial perspective view illustrating gas supply nozzles.

FIG. 15A and FIG. 15B are views illustrating a modification example of the process furnace according to the third embodiment of the present invention, in which FIG. 15A is a partial perspective view illustrating gas supply nozzles and FIG. 15B is a vertical sectional view illustrating the gas supply nozzles.

DETAILED DESCRIPTION OF THE PREFERRED EMBODIMENTS

Preferable embodiments of the present invention will be described hereinafter with reference to the attached drawings.

Figure 1:
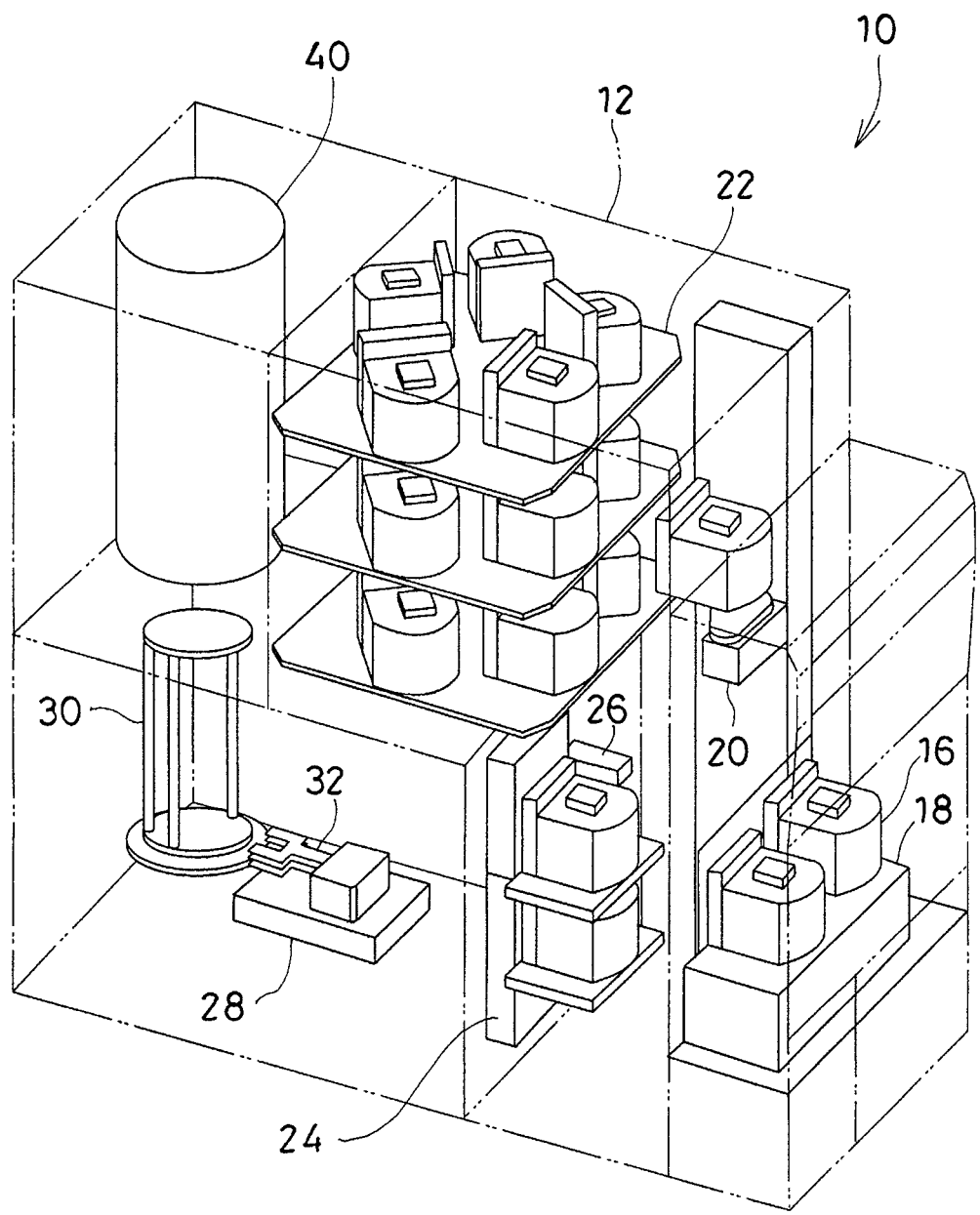
FIG. 1 is a perspective view illustrating a semiconductor manufacturing apparatus according to a first embodiment of the present invention.

First, with reference to FIG. 1, an explanation will be given on an example of a semiconductor manufacturing apparatus configured to form a SiC epitaxial film according to a first embodiment of the present invention.

A semiconductor manufacturing apparatus 10 being a substrate processing apparatus is a batch type vertical heat treatment apparatus and includes a case 12 in which main parts are disposed. In the semiconductor manufacturing apparatus 10, FOUPs (Front Opening Unified Pods, hereinafter referred to as pods) 16, which are substrate containers configured to accommodate substrates such as wafers 14 (refer to FIG. 2) made of Si or SiC, are used as wafer carriers. At the front side of the case 12, a pod stage 18 is disposed, and pods 16 are carried to the pod stage 18. For example, twenty five wafers 14 are accommodated in each pod 16, and the pod 16 is set on the pod stage 18 in a state where a cap of the pod 16 is closed.

At a front inner side of the case 12 facing the pod stage 18, a pod carrying device 20 is disposed. Furthermore, in the vicinity of the pod carrying device 20, a pod storage shelf 22, a pod opener 24, and a substrate counter 26 are disposed. The pod storage shelf 22 is disposed above the pod opener 24 and is configured such that a plurality of pods 16 can be placed and held on the pod storage shelf 22. The substrate counter 26 is disposed close to the pod opener 24, and the pod carrying device 20 carries a pod 16 among the pod stage 18, the pod storage shelf 22, and the pod opener 24. The pod opener 24 is used to open a cap of a pod 16, and after the cap of the pod 16 is opened, the substrate counter 26 is used to count the number of wafers 14 disposed in the pod 16.

In the case 12, a substrate transfer machine 28 and a boat 30 being a substrate holding tool are disposed. The substrate transfer machine 28 includes an arm (tweezers) 32 and is configured to be vertically moved and horizontally rotated by a driving unit (not shown). The arm 32 can pick up wafers 14

(for example, five wafers 14), and by operating the arm 32, wafers 14 can be carried between a pod 16 placed on the pod opener 24 and the boat 30.

The boat 30 is made of a heat-resistant material such as carbon graphite or SiC and is configured to hold a plurality of vertically stacked wafers 14 in a manner such that the wafers 14 are horizontally oriented and vertically arranged with the centers of the wafers 14 being aligned with each other. In addition, at the lower part of the boat 30, a boat insulating part 34 is disposed as a circular disk shaped insulating member made of a heat-resistant material such as quartz or SiC, so as to prevent heat transfer from a heating target object 48 (described later) to the lower side of a process furnace 40 (refer to FIG. 2).

At the rear upper part in the case 12, the process furnace 40 is disposed. The boat 30 in which a plurality of wafers 14 are held is loaded into the process furnace 40, and a heat treatment is performed.

Next, with reference to FIG. 2 and FIG. 3, an explanation will be given on the process furnace 40 of the semiconductor manufacturing apparatus 10 configured to form a SiC epitaxial film. A first gas supply nozzle 60 including a first gas supply inlet 68 through which at least a gas containing Si (silicon) atoms and a gas containing Cl (chlorine) atoms are supplied; a second gas supply nozzle 70 including a second gas supply inlet 72 through which at least a gas containing C (carbon) and a reducing gas are supplied; and a first gas exhaust outlet 90 are shown as representative examples. In addition, a third gas supply inlet 360 through which inert gas is supplied; and a second as exhaust outlet 390 are shown.

The process furnace 40 includes a reaction tube 42 that forms a cylindrical reaction chamber 44. The reaction tube 42 is made of a heat-resistant material such as quartz or SiC and has a cylindrical shape with a closed top side and an opened bottom side. The reaction chamber 44 is formed in the hollow part of the reaction tube 42 and is configured to accommodate vertically stacked substrates such as wafers 14 made of a material such as Si or SiC in a state where the wafers 14 are horizontally oriented and vertically arranged in the boat 30 with the centers of the wafers 14 being aligned with each other.

At the lower side of the reaction tube 42, a manifold 36 is installed concentrically with the reaction tube 42. The manifold 36 is made of a material such as stainless steel and has a cylindrical shape with opened top and bottom sides. The manifold 36 is installed to support the reaction tube 42. In addition, between the manifold 36 and the reaction tube 42, an O-ring (not shown) is installed as a seal member. The manifold 36 is supported by a holder (not shown) so that the reaction tube 42 can be vertically fixed. The reaction tube 42 and the manifold 36 constitute a reaction vessel.

The process furnace 40 includes the heating target object 48 configured to be heated, and an induction coil 50 as a magnetic field generating unit. The heating target object 48 is disposed in the reaction chamber 44 and is configured to be heated by a magnetic field generated by the induction coil 50 installed outside the reaction tube 42. As heat is generated from the heating target object 48, the inside of the reaction chamber 44 is heated.

Near the heating target object 48, a temperature sensor (not shown) is installed as a temperature detector configured to detect the inside temperature of the reaction chamber 44. The induction coil 50 and the temperature sensor are electrically connected to a temperature control unit 52, and the temperature control unit 52 is configured to adjust power to the induction coil 50 based on temperature information detected by the temperature sensor so as to obtain desired temperature distribution in the reaction chamber 44 at a predetermined time (refer to FIG. 4).

Preferably, among the first and second gas supply nozzles 10 and 70 and the first exhaust outlet 90 in the reaction chamber 44, vertically extending structures 400 having an arc-shaped cross sectional shape may be installed between the heating target object 48 and wafers 14 to fill the space between the heating target object 48 and the wafers. For example, as shown in FIG. 3, the structures 400 may be installed at opposite positions so that gases supplied through the first and second gas supply nozzles 60 and 70 may not flow around the wafers 14 along the inner wall of the heating target object 48. Preferably, the structures 400 may be made of an insulating material or carbon graphite for resisting heat and preventing generation of particles.

Between the heating target object 48 and the reaction tube 42, an insulator 54 is installed, which is made of a material that is hardly induction-heated, such as carbon felt. Owing to the insulator 54, heat transfer from the heating target object 48 to the reaction tube 42 or the outside of the reaction tube 42 can be suppressed.

In addition, at the outside of the induction coil 50, an outer insulating wall having a structure such as a water cooling structure is installed in a manner such that the outer insulating wall surrounds the reaction chamber 44 so as to prevent heat transfer from the inside of the reaction chamber 44 to an outside area. In addition, at the outside of the outer insulating wall, a magnetic field seal 58 is installed to prevent leakage of a magnetic field generated by the induction coil 50 to an outside area.

Figure 2:
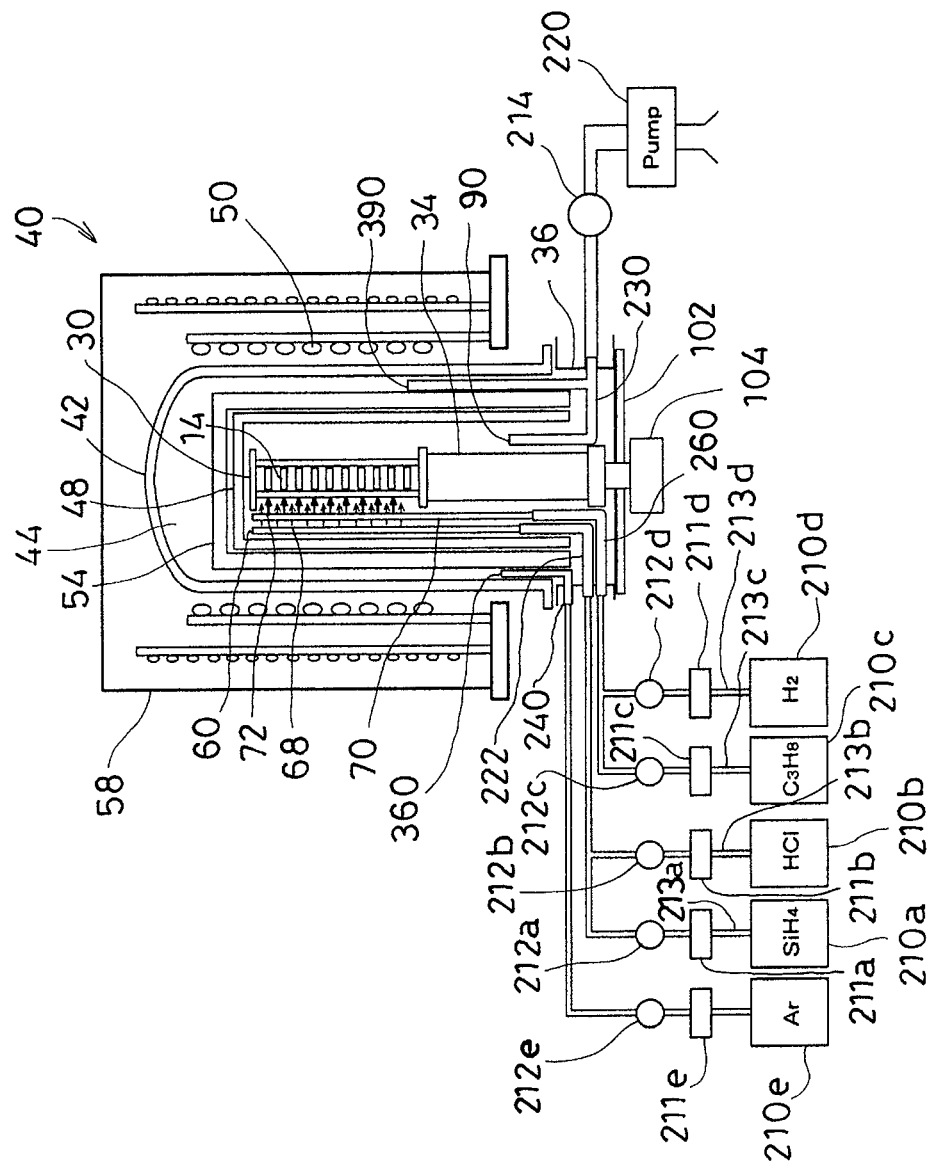
FIG. 2 is a side sectional view illustrating a process furnace according to the first embodiment of the present invention.

As shown in FIG. 2, between the heating target object 48 and the wafers 14, at least one first gas supply inlet 68 formed at the first gas supply nozzle 60 is disposed to supply at least a gas containing Si (silicon) atoms and a gas containing Cl (chlorine) atoms; and at least one second gas supply inlet 72 formed at the second gas supply nozzle 70 and the first exhaust outlet 90 are disposed at positions different from the position of the first gas supply nozzle 60. The second gas supply inlet 72 is configured to supply at least a gas containing C (carbon) atoms and a reducing gas. Furthermore, between the reaction tube 42 and the insulator 54, the third gas supply inlet 360 and the second exhaust outlet 390 are disposed.

The first gas supply inlet 68 is made of a material such as carbon graphite and is provided in the reaction chamber 44, and the first gas supply nozzle 60 is installed through the manifold 36. The first gas supply inlet 68 is configured to supply at least a gas containing Si (silicon) atoms such as monosilane (hereinafter referred to as $SiH_4$) gas and a gas containing Cl (chlorine) atoms such as hydrogen chloride (hereinafter referred to as HCl) gas into the reaction chamber 44 through the first gas supply nozzle 60. The first gas supply nozzle 60 may be provided in plurality.

The first gas supply nozzle 60 is connected to a first gas line 222. For example, the first gas line 222 is connected to gas pipes 213$a$ and 213$b$, and for supplying gases such as $SiH_4$ gas and HCl gas, the gas pipes 213$a$ and 213$b$ are connected to a $SiH_4$ gas supply source 210$a$ and a HCl gas supply source 210$b$ through flow controllers (flow rate control units) such as mass flow controllers (hereinafter referred to as MFCs) 211$a$ and 211$b$, and valves 212$a$ and 212$b$.

Owing to this structure, the flow rates, concentrations, and partial pressures of gases such as $SiH_4$ gas and HCl gas can be controlled in the reaction chamber 44. The valves 212$a$ and 212$b$ and the MFCs 211$a$ and 211$b$ are electrically connected to a gas flow rate control unit 78, so that the supply flow rates of the gases can be individually controlled to predetermined levels at predetermined times (refer to FIG. 4). A first gas supply system is constituted by the SiH4 gas supply source 210a, the HCl gas supply source 210b, the valves 212a and 212b, the MFCs 211a and 211b, the gas pipes 213a and 213b, the first gas line 222, the first gas supply nozzle 60, and the at least one first gas supply inlet 68 disposed at the first gas supply nozzle 60.

In the above description, HCl gas is mentioned as an example of a gas containing Cl (chlorine) atoms. However, a chlorine gas may be used instead of HCl gas.

Furthermore, in the above description, a gas containing Si (silicon) atoms and a gas containing Cl (chlorine) atoms are supplied. However, a gas containing Si (silicon) atoms and Cl (chlorine) atoms such as tetrachlorosilane (hereinafter referred to as $SiCl_4$) gas, trichlorosilane (hereinafter referred to as $SiHCl_3$) gas, or dichlorosilane (hereinafter referred to as $SiH_2Cl_2$) gas may be supplied.

The second gas supply inlet 72 is made of a material such as carbon graphite and is disposed in the reaction chamber 44, and the second gas supply nozzle 70 is installed through the manifold 36. The second gas supply inlet 72 is configured to supply at least a gas containing C (carbon) atoms such as propane (hereinafter referred to as $C_3H_8$) gas and a reducing gas such as hydrogen (H atom or $H_2$ molecule, hereinafter collectively referred to as $H_2$) gas into the reaction chamber 44 through the second gas supply nozzle 70. The second gas supply nozzle 70 may be provided in plurality.

The second gas supply nozzle 70 is connected to a second gas line 260. For example, the second gas line 260 is connected to gas pipes 213c and 213d. For supplying a gas containing C (carbon) atoms such as $C_3H_8$ gas, the gas pipe 213c is connected to a $C_3H_8$ gas supply source 210c through a flow rate control unit such as an MFC 211c and a valve 212c. For supplying a reducing gas such as $H_2$ gas, the gas pipe 213d is connected to a $H_2$ gas supply source 210d through a flow rate control unit such as an MFC 211d and a valve 212d.

Owing to this structure, the flow rates, concentrations, and partial pressures of gases such as $C_3H_8$ gas and $H_2$ gas can be controlled in the reaction chamber 44. The valves 212c and 212d and the MFCs 211c and 211d are electrically connected to the gas flow rate control unit 78, so that the supply flow rates of the gases can be controlled to predetermined levels at predetermined times (refer to FIG. 4). A second gas supply system is constituted by the $C_3H_8$ gas source 210c, the $H_2$ gas supply source 210d, the valves 212c and 212d, the MFCs 211c and 211d, the gas pipes 213c and 213d, the second gas line 260, the second gas supply nozzle 70, and the second gas supply inlet 72.

In the above description, the second gas supply system is constituted by the $C_3H_8$ gas source 210c, the $H_2$ gas supply source 210d, the valves 212c and 212d, the MFCs 211c and 211d, the gas pipes 213c and 213d, the second gas line 260, the second gas supply nozzle 70, and the second gas supply inlet 72. However, instead of that, the second gas supply system may be constituted by the $H_2$ gas supply source 210d, the valve 212d, the MFC 211d, the gas pipe 213d, and the second gas line 260, the second gas supply nozzle 70, and the second gas supply inlet 72; and a third gas supply system may be constituted by the $C_3H_8$ gas source 210c, the valve 212c, the MFC 211c, and the gas pipe 213c. In this case, the third gas supply system may be connected to the first gas supply system or the second gas supply system.

In the above description, $C_3H_8$ gas is mentioned as an example of a gas containing C (carbon) atoms. However, ethylene (hereinafter referred to as $C_2H_4$) gas or acetylene (hereinafter referred to as $C_2H_2$) gas may be used instead of $C_3H_8$ gas.

In addition, so as to uniformly supply gases to wafers 14 held in the boat 30, in substrate arranged regions of the first and second gas supply nozzles 60 and 70, the first and second gas supply inlets 68, 72 may be formed to face the respective wafers 14. This may be preferable because the in-surface film thickness uniformity of the wafers 14 can be easily controlled.

In the substrate arranged regions of the first and second gas supply nozzles 60 and 70, at least one first gas supply inlet 68 and at least one second gas supply inlet 72 may be provided, or each first gas supply inlet 68 and each second gas supply inlet 70 may be provided for a predetermined number of wafers 14.

In addition, in the first embodiment, a gas containing Si (silicon) atoms and a gas containing Cl (chlorine) atoms are supplied through the first gas supply nozzle 60, and a gas containing C (carbon) atoms and a reducing gas are supplied through the second gas supply nozzle 70. However, the present invention is not limited thereto. For example, as many gas supply nozzles as the kinds of gases may be installed to supply gases into the reaction chamber 44.

Next, an explanation will be given on the reason of providing the first gas supply system and the second gas supply system described above. In a conventional semiconductor manufacturing apparatus configured to form a SiC epitaxial film, source gases such as a gas containing Si (silicon) atoms, a gas containing C (carbon) atoms, and a reducing gas are supplied into a reaction chamber 44 through one spot so as to form a SiC epitaxial film. In the case where wafers 14 made of a material such as SiC are horizontally positioned and arranged in multiple stages like in the current embodiment, source gases are supplied into the reaction chamber 44 through a gas supply nozzle installed in the reaction chamber 44. In this time, the sources gases react with each other in the gas supply nozzle, and thus they are consumed in the gas supply nozzle. Thus, the source gases become insufficient at the downstream side of the reaction chamber 44, and other problems also occur. For example, the gas supply nozzle is clogged by deposits such as a SiC epitaxial film deposit formed by reaction between the source gases in the gas supply nozzle; supply of the source gases becomes unstable, and undesired particles are generated.

Figure 5:
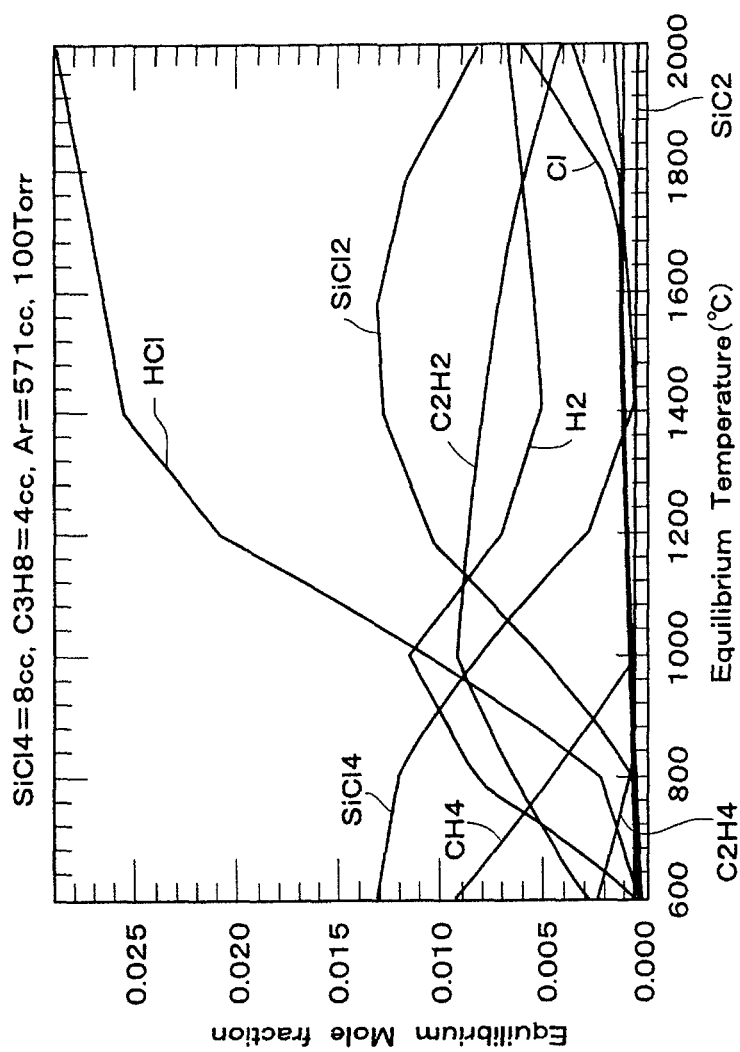
FIG. 5 is a graph illustrating an equilibrium state of gas supply conditions with respect to temperature according to the related art.
Figure 6:
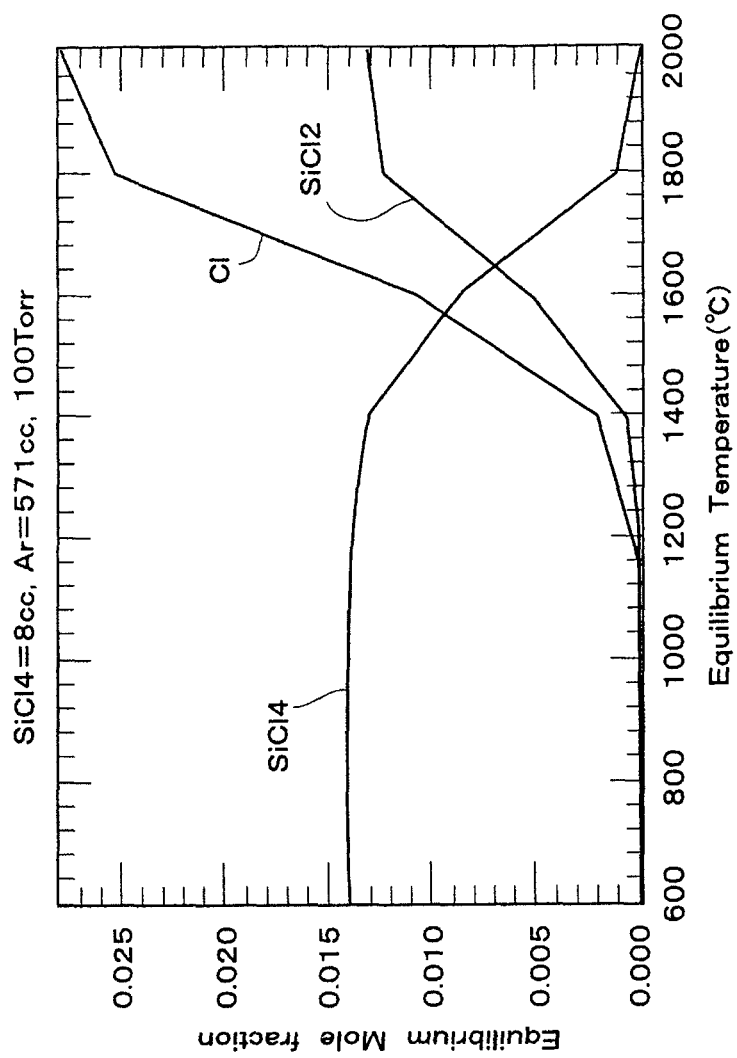
FIG. 6 is a graph illustrating an equilibrium state of gas supply conditions with respect to temperature according to the present invention.
Figure 7:
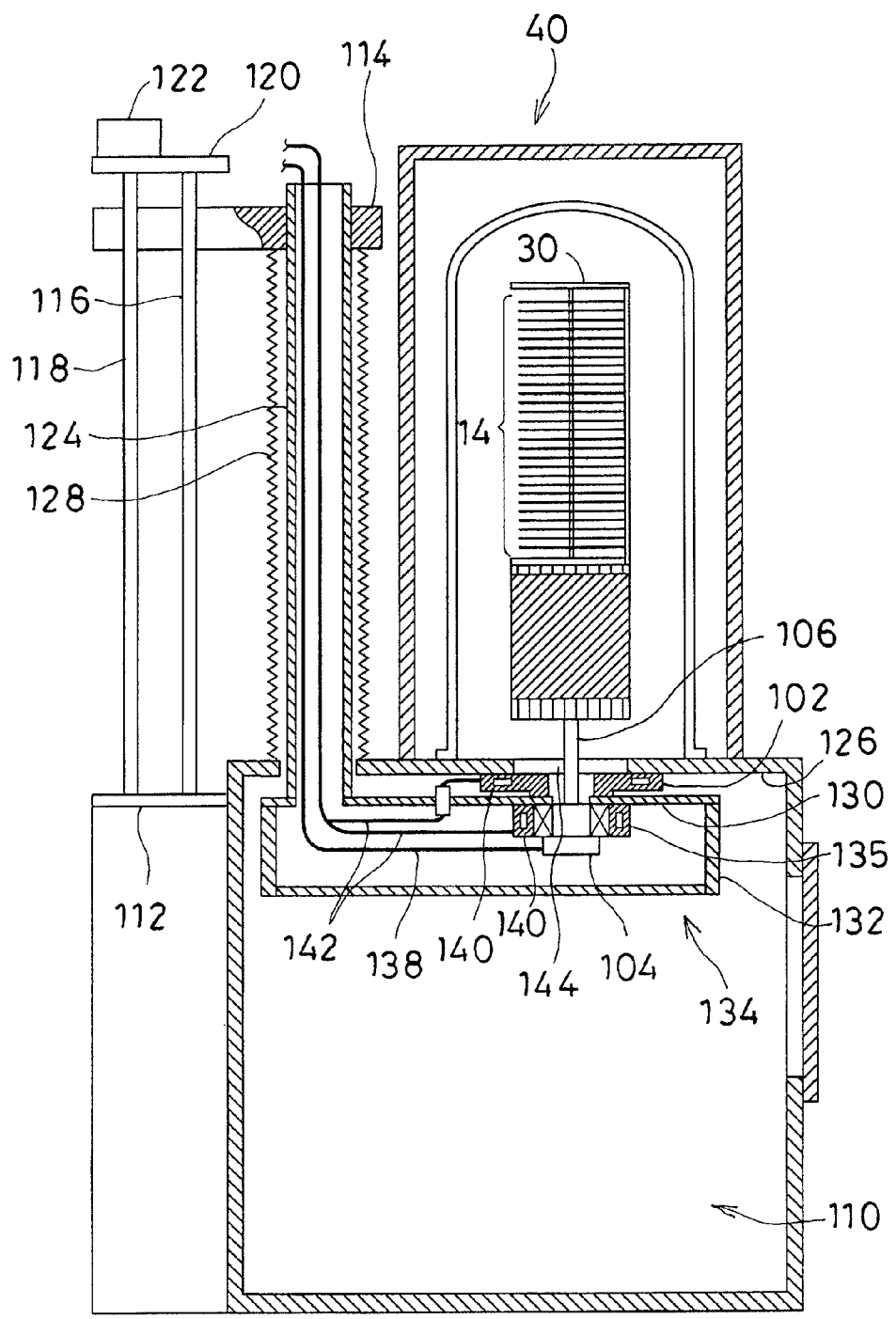
FIG. 7 is a schematic view illustrating the process furnace of the semiconductor manufacturing apparatus and the surrounding structures of the process furnace according to the first embodiment of the present invention.

In the current embodiment, to solve these problems, calculations were performed as shown in FIG. 5 and FIG. 6. FIG. 5 illustrates an equilibrium state with respect to temperature in the case where $SiCl_4$ gas, $C_3H_8$ gas, and argon (hereinafter referred to as Ar) gas were supplied as a gas containing Si (silicon) atoms, a gas containing C (carbon) atoms, and rare gas at a ratio of $SiCl_4:C_3H_8:Ar=8:4:571$.

At that time, the flow rate of $SiCl_4$ gas was set to 8.0 sccm, the flow rate of $C_3H_8$ gas was set to 4.0 sccm, and the flow rate of Ar gas was set to 571 sccm; and pressure was set to 100 Torr. In that way, the inside state of a gas supply nozzle was simulated for the case where $SiCl_4$ gas, $C_3H_8$ gas, and Ar gas were supplied through the gas supply nozzle. Here, a chemical equilibrium state means a state that gases can reach after the gases having initial mole fractions are kept at the same temperature for infinite time. In FIG. 5, the horizontal axis denotes an equilibrium temperature, and the vertical axis denotes mole fractions of source gases and newly generated gases as results of decomposition or bonding of the source gases. However, Ar gas is not shown in FIG. 5.

Referring to FIG. 5, in the temperature range from at least 1000° C. to 1600° C., the mole fractions of HCl gas, $SiCl_2$ gas, $C_2H_2$ gas, and $H_2$ gas are high. That is, in the temperature range in which SiC epitaxially growth is possible, if $SiCl_4$ gas, $C_3H_8$ gas, and Ar gas are supplied through the gas supply nozzle disposed in the reaction chamber 44, HCl gas, $SiCl_2$ gas, $C_2H_2$ gas, and $H_2$ are generated in the gas supply nozzle. For example, in an equilibrium state at 1400° C., the mole fractions of HCl gas, $SiCl_2$ gas, $C_2H_2$ gas, and $H_2$ may be high in this order, and due to a reaction between the $SiCl_2$ gas and $C_2H_2$ gas, a SiC polycrystalline (hereinafter referred to as SiC-Poly) film may be formed in the gas supply nozzle.

At this time, although HCl gas may act as an etching gas, the etching effect of HCl on SiC is small at 1500° C. or lower. Thus, due to growth of a SiC-Poly film, the gas supply nozzle is clogged, and due to stripping of the SiC-Poly film adhered to the gas supply nozzle, particles are generated.

To solve the above-described problems, the calculation of FIG. 6 was performed after excluding a gas containing C atoms from the conditions of the calculation of FIG. 5. FIG. 6 illustrates an equilibrium state with respect to temperature in the case where $SiCl_4$ gas were supplied as a gas containing Si atoms and Cl atoms and Ar gas was supplied as rare gas at a ratio of $SiCl_4$:Ar=8:571.

At that time, the flow rate of $SiCl_4$ gas was set to 8.0 sccm and the flow rate of Ar gas was set to 571 sccm; and pressure was set to 100 Torr. In that way, the inside state of the gas supply nozzle was simulated for the case where $SiCl_4$ gas and Ar gas were supplied through the gas supply nozzle according to the current embodiment. In FIG. 6, Ar gas is not shown.

Referring to FIG. 6, most of $SiCl_4$ gas does not decompose up to about 1200° C. The reason for this may be as follows. In the case of FIG. 5, it is considered that a reducing reaction of $SiCl_4$ gas occurs due to H atoms included in $C_3H_8$; however, in the case of FIG. 6, it is considered that most of $SiCl_4$ gas does not decompose up to about 1200° C. because $C_3H_8$ gas does not exist. In addition, as is known, since $SiCl_4$ gas alone does not contribute to formation of a film, deposits such as a Poly-Si film may not be formed in the gas supply nozzle up to at least 1200° C.

At temperatures equal to or higher than 1200° C., $SiCl_4$ gas decomposes into $SiCl_2$ gas and Cl gas. Although a film such as a Poly-Si film can be formed due to $SiCl_2$ gas, since the etching effect of Cl gas is high, a film may not be deposited in the gas supply nozzle. In addition, since H atoms or $H_2$ does not exist in the gas supply nozzle, a film forming reaction such as $SiCl_2+H_2 \rightarrow Si$ (solid)+2HCl does not occur, and thus it is considered that a film is not adhered to the inside of the gas supply nozzle.

Therefore, by supplying at least a gas containing Si (silicon) atoms and a gas containing Cl (chlorine) atoms through the first gas supply nozzle 60 and at least a gas containing C (carbon) atoms and a reducing gas through the second gas supply nozzle 70, consumption of source gases in the gas supply nozzles 60 and 70, clogging of the gas supply nozzles 60 and 70 caused by deposits, and generation of particles caused by deposits can be suppressed.

Preferably, a gas containing Si (silicon) atoms, a gas containing Cl (chlorine) atoms, and a rare gas such as Ar gas (a carrier gas) may be supplied through the first gas supply nozzle 60, and a gas containing C (carbon) atoms and a reducing gas such as $H_2$ gas may be supplied through the second gas supply nozzle 70.

More preferably, a gas containing Si atoms and Cl atoms such as $SiCl_4$ gas and a rare gas such as Ar gas (a carrier gas) may be supplied through the first gas supply nozzle 60, and a gas containing C (carbon) atoms and a reducing gas such as $H_2$ gas may be supplied through the second gas supply nozzle 70.

In addition, a dopant gas may be further supplied into the reaction chamber 44 through the first gas supply inlet 68 or the second gas supply inlet 72.

Alternatively, a dopant gas may be supplied into the reaction chamber 44 through an additional gas supply nozzle.

Preferably, in the cases of FIG. 5 and FIG. 6, the supply flow rate of inert gas such as Ar gas may be 1/10 or greater than the supply flow rate of $H_2$ gas. More preferably, the supply flow rate of Ar gas may be ½ or smaller than the supply flow rate of $H_2$ gas.

Therefore, Ar gas can be supplied through the first gas supply inlet 68 together with at least a gas containing Si (silicon) atoms, and hydrogen gas can be supplied through the second gas supply inlet 72 together with at least a gas containing C (carbon) atoms, in a manner such that the gases are uniformly supplied to vertically stacked wafers 14. Thus, SiC epitaxial films having predetermined film quality can be formed on the vertically stacked wafers 14 at a time.

Figure 17:
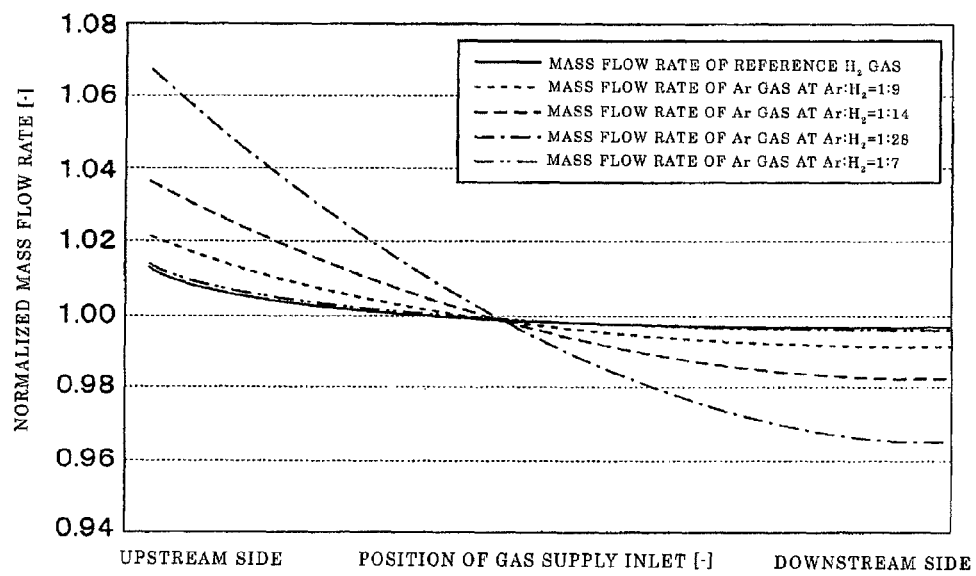
FIG. 17 is a graph illustrating mass fluxes of Ar gas and $H_2$ gas supplied through gas supply inlets according to the present invention.

FIG. 17 illustrates the mass flow rate distribution of $H_2$ gas (denoted by a solid line) ejected through a gas supply inlet and the mass flow rate distribution of Ar gas (denoted by broken lines) ejected through a gas supply inlet in the case where the $H_2$ gas and Ar gas are supplied through a gas supply nozzle having the same shape. FIG. 17 illustrates the flow rate of the Ar gas which is varied based on the flow rate of the $H_2$ gas in the range from $Ar/H_2$=1/28 to 1/7. As shown in FIG. 17, if the supply flow rate of Ar gas is lower than 1/10 of the supply flow rate of $H_2$ gas, the behavior of the Ar gas supplied through the first gas supply inlet 68 may be largely different from the behavior of the $H_2$ gas supplied through the second gas supply inlet 72, and the supply amount of the Ar gas may be large at an upstream side but insufficient at a download side. At this time, since the concentration distribution of C is dependent on the concentration distribution of the hydrogen carrier and the concentration distribution of Si is dependent on the concentration distribution of the Ar carrier, SiC epitaxial films may be formed on stacked wafers 14 in a state where C/Si distribution varies in a height direction.

Figure 18:
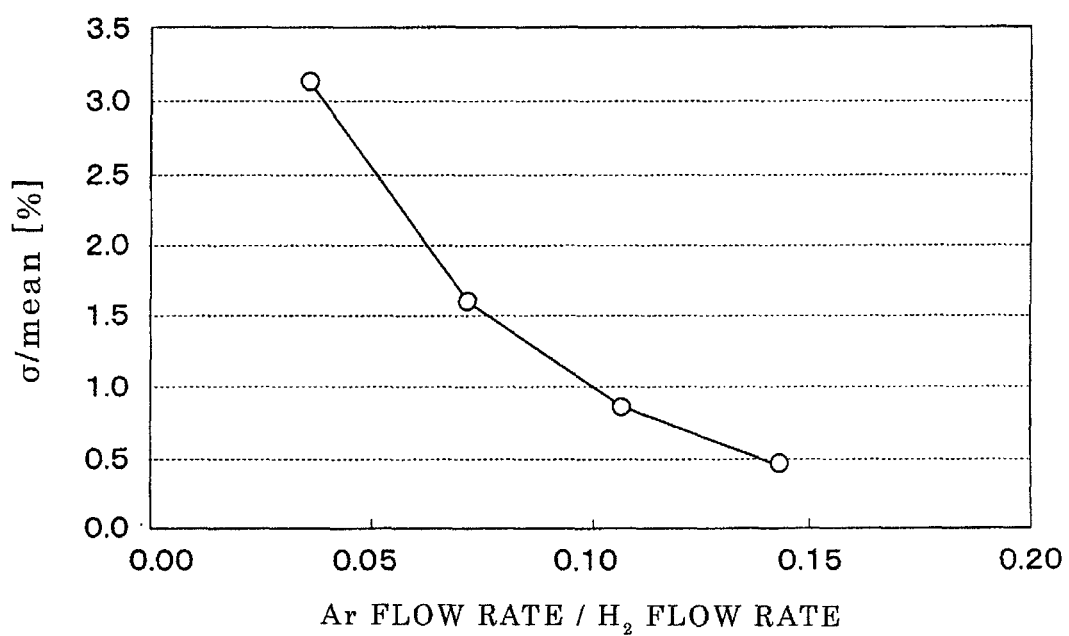
FIG. 18 is a graph illustrating deviations of flow rates of Ar gas and $H_2$ gas supplied through the gas supply inlets according to the present invention.

In addition, FIG. 18 illustrates deviations (σ/mean [%]) of flow rates of Ar gas and $H_2$ gas supplied through the gas supply inlets with respect to the ratio of Ar gas/$H_2$ gas. In FIG. 18, the vertical axis denotes σ/mean [%] which is obtained by dividing the flow rate of gas supplied through a gas supply inlet formed in a gas supply nozzle by the average flow rate of the gas supplied through the gas supply inlet of the gas supply nozzle, and the horizontal axis denotes a value obtained by dividing the supply flow rate of Ar gas by the supply flow rate of $H_2$ gas.

As shown in FIG. 18, as the supply flow rate of $H_2$ gas increases as compared with the supply flow rate of Ar gas or the supply flow rate of Ar gas decreases as compared with the supply flow rate of $H_2$ gas, the gas flow rate at the upstream side of the gas supply nozzle becomes more different from the gas supply rate at the downstream side and the σ/mean value becomes large. In this case, the C/Si ratio of Si epitaxial films formed on wafers 14 may be largely varied according to the stacked positions of the wafers 14 in the boat 30.

It is preferable that the σ/mean value be kept equal to or lower than 1.0%, and in this case, SiC epitaxial films may be formed on the stacked wafers 14 with a uniform C/Si ratio. Referring to FIG. 18, when the supply flow rate of Ar gas is greater than 1/10 of the supply flow rate of $H_2$ gas, the σ/mean becomes 1.0% or lower. Thus, to form uniform-quality SiC epitaxial films, it is preferable that the supply flow rate of Ar gas be kept 1/10 or greater than the supply flow rate of $H_2$ gas.

In addition, when the supply flow rate of Ar gas is greater than ½ of the supply flow rate of $H_2$ gas, members constituting a region where wafers 14 are stacked and members disposed in the region may be damaged by Ar gas ejected at a high speed, and thus particles or contaminants may be generated from the damaged members. Therefore, so as to prevent generation of particles and contaminants, it is preferable that the supply flow rate of Ar gas be kept equal to or lower than ½ of the supply flow rate of $H_2$ gas.

Accordingly, it is preferable that the supply flow rate of Ar gas be equal to or greater than 1/10 of the supply flow rate of $H_2$ gas which is a reducing gas but equal to or lower than ½ of the supply flow rate of $H_2$ gas, and by controlling the ratio of the supply flow rate of Ar gas and the supply flow rate of $H_2$ gas, the flow rates of gases supplied through the first gas supply inlet 68 and the second gas supply inlet 72 can be uniformly maintained.

Figure 3:
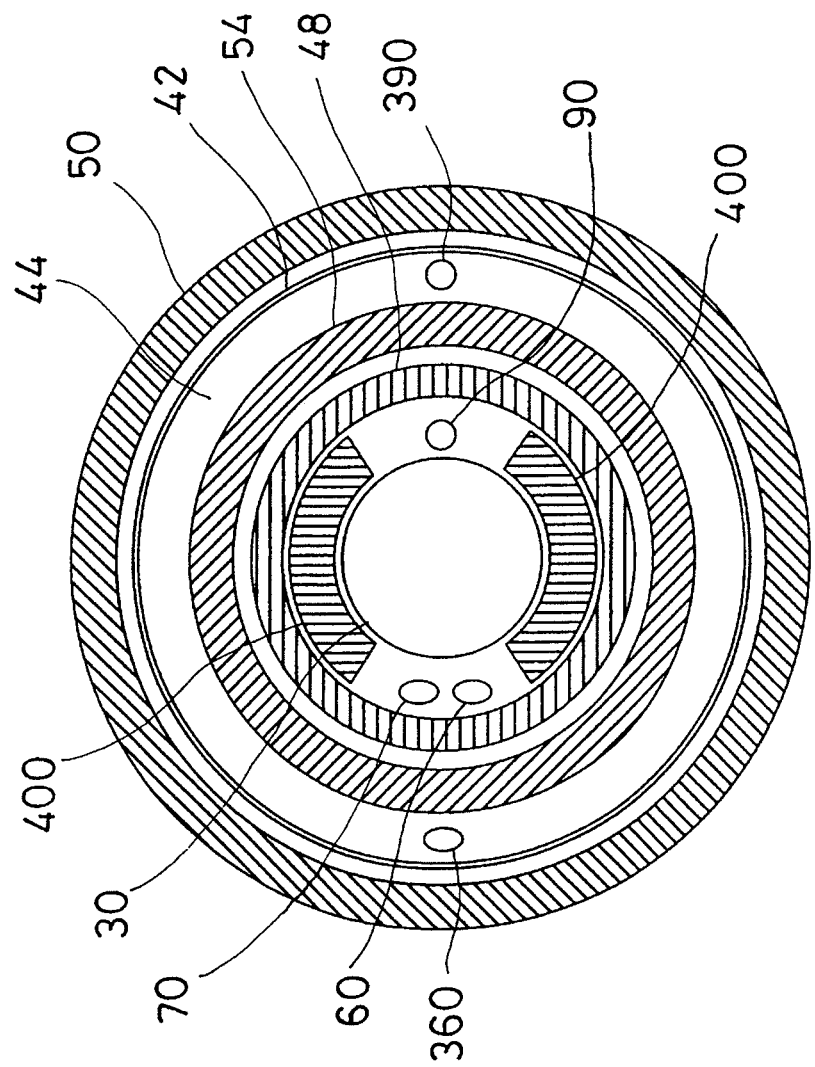
FIG. 3 is a cross-sectional view illustrating the process furnace according to the first embodiment of the present invention.

In addition, as shown in FIG. 3, the first exhaust outlet 90 is disposed at a position opposite to the first and second gas supply inlets 68, 72, and a gas exhaust pipe 230 connected to the first exhaust outlet 90 is installed through the manifold 36. A vacuum exhaust device 220 such as a vacuum pump is connected to the downstream side of the gas exhaust pipe 230 through a pressure detector (not shown) such as a pressure sensor and a pressure regulator such as an automatic pressure controller (APC) valve 214. The pressure sensor and the APC valve 214 are electrically connected to a pressure control unit 98, and the pressure control unit 98 is configured to adjust the opening degree of the APC valve 214 based on pressures detected by the pressure sensor for controlling the inside pressure of the process furnace 40 to a predetermined level at a predetermined time (refer to FIG. 4).

As described above, at least a gas containing Si (silicon) atoms and a gas containing Cl (chlorine) atoms are supplied through the first gas supply inlet 68; at least a gas containing C (carbon) atoms and a reducing gas are supplied through the second gas supply inlet 72; and the supplied gases flow in parallel with wafers 14 made of Si or SiC and are discharged through the first exhaust outlet 90. Therefore, all the wafers 14 can be exposed to the gases efficiently and uniformly.

In addition, as shown in FIG. 3, the third gas supply inlet 360 is disposed between the reaction tube 42 and the insulator 54 and penetrates the manifold 36. In addition, the second exhaust outlet 390 is disposed between the reaction tube 42 and the insulator 54 at a position opposite to the third gas supply inlet 360 and is connected to the gas exhaust pipe 230. The third gas supply inlet 360 is formed in a third gas line 240 penetrating the manifold 36 and is connected to a gas supply source 210e through a valve 212e and an MFC 211e. Inert gas such as Ar gas (rare gas) is supplied from the gas supply source 210e, so that gases contributed to formation of SiC epitaxial films such as a gas containing Si (silicon) atoms, a gas containing C (carbon) atoms, a gas containing Cl (chlorine) atoms, or a mixture thereof can be prevented from permeating between the reaction tube 42 and the insulator 54, and adhesion of unnecessary matters to the inner wall of the reaction tube 42 or the outer wall of the insulator 54 can be prevented.

In addition, insert gas supplied between the reaction tube 42 and the insulator 54 is exhausted through the second exhaust outlet 390 to the gas exhaust pipe 230, and at the downstream side of the gas exhaust pipe 230, the inert gas is exhausted from the vacuum exhaust device 220 through the APC valve 214.

In the first embodiment, $H_2$ gas is mentioned as an example of a reducing gas. However, the present invention is not limited thereto. For example, at least one of a gas containing H (hydrogen) atoms and rare gases such as Ar (argon) gas, He (helium) gas, Ne (neon) gas, Kr (krypton) gas, and Xe (xenon) gas may be used; or a mixture thereof may be used.

Next, the surrounding structures of the process furnace 40 will be described.

At the bottom side of the process furnace 40, a seal cap 102 is installed as a furnace port cover to hermetically close the bottom-side opening of the process furnace 40. The seal cap 102 is made of a metal such as stainless steel and has a circular disk shape. On the top surface of the seal cap 102, an O-ring (not shown) is installed as a seal member configured to make contact with the bottom side of the process furnace 40. At the seal cap 102, a rotary mechanism 104 is installed. A rotation shaft 106 of the rotary mechanism 104 is connected to the boat 30 through the seal cap 102 and is configured to rotate wafers 14 by rotating the boat 30.

The seal cap 102 is configured to be vertically lifted and lowered by an elevating motor 122 (described later) installed at the outside of the process furnace 40 as an elevating mechanism, so as to load the boat 30 into the process furnace 40 and unload the boat 30 from the process furnace 40. The rotary mechanism 104 and the elevating motor 122 are electrically connected to a driving control unit 108, and thus predetermined operations can be performed at predetermined times under the control of the driving control unit 108 (refer to FIG. 4).

At the outer surface of a loadlock chamber 110 which is a preliminary chamber, a lower base plate 112 is installed. A guide shaft 116 slidably fitted in an elevating table 114, and a ball screw 118 screw-coupled to the elevating table 114 are installed at the lower base plate 112. On the upper ends of the guide shaft 116 and the ball screw 118 erected on the lower base plate 112, an upper base plate 120 is installed. The ball screw 118 is rotated by the elevating motor 122 installed on the upper base plate 120. As the ball screw 118 is rotated, the elevating table 114 is lifted or lowered.

At the elevating table 114, a hollow elevating shaft 124 is installed to be extended from the elevating table 114, and a joint part between the elevating table 114 and the elevating shaft 124 is hermetically sealed. The elevating shaft 124 is configured to be lifted and lowered together with the elevating table 114. The elevating shaft 124 is movably inserted through a top plate 126 of the loadlock chamber 110. A penetration hole of the top plate 126 through which the elevating shaft 124 is movably inserted is sufficiently large so that the elevating shaft 124 does not make contact with the top plate 126 at the penetration hole.

Between the loadlock chamber 110 and the elevating table 114, a bellows 128 is installed to enclose the elevating shaft 124 as a hollow stretchy part, so that the loadlock chamber 110 can be hermetically sealed. The bellows 128 can be sufficiently expanded and contracted in accordance with lifting and lowering motions of the elevating table 114, and the bellows 128 has an inner diameter sufficiently greater than the outer diameter of the elevating shaft 124 so as not to make contact with the elevating shaft 124 during expansion or contraction.

An elevating base plate 130 is horizontally fixed to the lower end of the elevating shaft 124. A driving unit cover 132 is hermetically attached to the bottom surface of the elevating base plate 130 with a seal member such as an O-ring being disposed therebetween. The elevating base plate 130 and the driving unit cover 132 constitute a driving unit accommodation case 134. In this way, the inside of the driving unit accommodation case 134 is isolated from the inside atmosphere of the loadlock chamber 110.

In addition, the rotary mechanism 104 for the boat 30 is installed in the driving unit accommodation case 134, and the periphery of the rotary mechanism 104 is cooled by a cooling mechanism 135.

A power supply cable 138 extends from the upper end of the elevating shaft 124 to the rotary mechanism 104 through the hollow part of the elevating shaft 124, and then the power supply cable 138 is connected to the rotary mechanism 104. In addition, cooling channels 140 are formed in the cooling mechanism 135 and the seal cap 102. Coolant conduits 142 extend from the upper end of the elevating shaft 124 to the cooling channels 140 through the hollow part of the elevating shaft 124, and then the coolant conduits 142 are connected to the cooling channels 140.

By rotating the ball screw 118 using the elevating motor 122, the driving unit accommodation case 134 can be lifted or lowered through the elevating table 114 and the elevating shaft 124.

If the driving unit accommodation case 134 is lifted, a furnace port 144 which is an opening of the process furnace 40 is closed by the seal cap 102 hermetically installed on the elevating base plate 130, and thus a wafer processible state can be made. If the driving unit accommodation case 134 is lowered, the boat 30 is also lowered together with the seal cap 102, and in this state, wafers 14 can be carried to an outside area.

Figure 4:
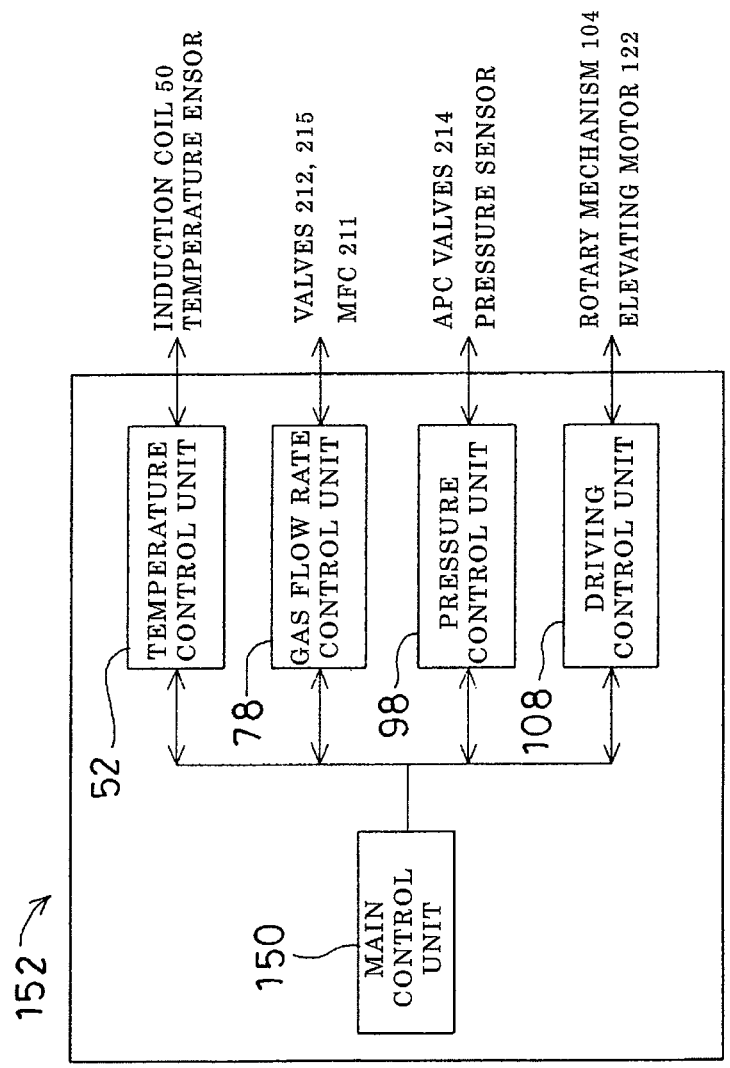
FIG. 4 is a view illustrating a configuration for controlling parts of the semiconductor manufacturing apparatus according to the first embodiment of the present invention.

FIG. 4 is a view illustrating a configuration for controlling parts of the semiconductor manufacturing apparatus 10 configured to form a SiC epitaxial film.

The temperature control unit 52, the gas flow rate control unit 78, the pressure control unit 98, and the driving control unit 108 constitute a manipulation unit and an input/output unit and are electrically connected to a main control unit 150 that controls the overall operation of the semiconductor manufacturing apparatus 10. The temperature control unit 52, the gas flow rate control unit 78, the pressure control unit 98, and the driving control unit 108 are configured as a controller 152.

Next, an explanation will be given on a method of forming a SiC film on a substrate such as a SiC wafer 14 by using the above-described semiconductor manufacturing apparatus 10 in one of semiconductor device manufacturing processes. In the following explanation, each part of the semiconductor manufacturing apparatus 10 is controlled by the controller 152.

First, if a pod 16 accommodating a plurality of wafers 14 is set on the pod stage 18, the pod carrying device 20 carries the pod 16 from the pod stage 18 to the pod storage shelf 22 so that the pod storage shelf 22 can be stocked with the pod 16. Next, the pod carrying device 20 carries the pod 16 from the pod storage shelf 22 to the pod opener 24 and sets the pod 16 on the pod opener 24; the pod opener 24 opens a cap of the pod 16; and the substrate counter 26 detects the number of the wafers 14 accommodated in the pod 16.

Next, the substrate transfer machine 28 picks up wafers 14 from the pod 16 placed on the pod opener 24 and transfers the wafers 14 to the boat 30.

After a plurality of wafers 14 are charged into the boat 30, the boat 30 in which the wafers 14 are held is loaded into the reaction chamber 44 (boat loading) as the elevating table 114 and the elevating shaft 124 are lifted by the elevating motor 122. At this time, the bottom side of the manifold 36 is sealed by the seal cap 102 in a state where the O-ring (not shown) being disposed between the manifold 36 and the seal cap 102.

After the boat 30 is loaded, the inside of the reaction chamber 44 is vacuum-evacuated by the vacuum exhaust device 220 to a predetermined pressure (vacuum degree). At this time, the inside pressure of the reaction chamber 44 is measured using the pressure sensor (not shown), and based on the measured pressure, the APC valve 214 communicating with the first exhaust outlet 90 and the second exhaust outlet 390 is feedback-controlled. In addition, the heating target object 48 is heated to increase the temperature of the wafers 14 and the inside of the reaction chamber 44 to a predetermined level. At this time, to obtain predetermined temperature distribution in the reaction chamber 44, power to the induction coil 50 is feedback-controlled based on temperature information detected by the temperature sensor (not shown). Subsequently, the rotary mechanism 104 rotates the boat 30 to rotate the wafers 14 charged in the boat 30.

Next, for a SiC epitaxial growth reaction, a gas containing Si (silicon) atoms and a gas containing Cl (chlorine) atoms are supplied respectively from the gas sources 210a and 210b, and the gases are ejected to the inside of the reaction chamber 44 through the first gas supply inlet 68. In addition, after adjusting the opening degrees of the MFCs 211c and 211d to control the flow rates of a gas containing C (carbon) atoms and a reducing gas such as $H_2$ gas, the valves 212c and 212d are opened to introduce the gases into the reaction chamber 44 through the second gas line 260, the second gas supply nozzle 70, and the second gas supply inlet 72.

The gases supplied through the first and second gas supply inlets 68, 72 are allowed to flow through the inside of the heating target object 48 provided in the reaction chamber 44, and the gases are discharged through the first exhaust outlet 90 and the gas exhaust pipe 230. When the gases supplied through the first and second gas supply inlets 68, 72 flow through the inside of the reaction chamber 44, the gases make contact with the wafers 14 made of a material such as SiC so that SiC epitaxial films can be grown on the surfaces of the wafers 14.

In addition, inert gas such as Ar gas is supplied from the gas supply source 210e. To adjust the flow rate of the inert gas to a predetermined level, the opening degree of the corresponding MFC 211e is adjusted, and then the valve 212e is opened so that the inert gas can be supplied into the reaction chamber 44 through the third gas line 240 and the third gas supply inlet 360. The Ar gas (rare gas) supplied through the third gas supply inlet 360 as inert gas is allowed to flow between the insulator 54 and the reaction tube 42 in the reaction chamber 44 and is discharged through the second exhaust outlet 390.

After a predetermined time, supply of the gases is terminated, and inert gas is supplied from an inert gas supply source (not shown) to replace the inside atmosphere of the heating target object 48 with the inert gas and adjust the inside pressure of the reaction chamber 44 back to atmospheric pressure.

Thereafter, the seal cap 102 is lowered by the elevating motor 122 to open the bottom side of the manifold 36, and along with this, the processed wafers 14 are unloaded from the reaction tube 42 through the bottom side of the manifold 36 in a state where the processed wafers 14 are held in the boat 30 (boat unloading), and the boat 30 is left at a predetermined position until all the wafers 14 held in the boat 30 are cooled. Next, if the wafers 14 of the boat 30 are cooled to a predetermined temperature, the substrate transfer machine 28 picks up the wafers 14 from the boat 30 and carries the wafers 14 into an empty pod 16 set on the pod opener 24. Thereafter, the pod carrying device 20 carries the pod 16 in which the wafers 14 are accommodated to the pod storage shelf 22 or the pod stage 18. In this way, a series of operations of the semiconductor manufacturing apparatus 10 is completed.

As described above, by supplying at least a gas containing Si (silicon) atoms and a gas containing Cl (chlorine) atoms through the first gas supply inlet 68 and at least a gas containing C (carbon) atoms and a reducing gas through the second gas supply inlet 72, growth of a deposition film can be suppressed in the first gas supply nozzle 60 and the second gas supply nozzle 70; and owing to reactions among the gas containing Si (silicon) atoms, the gas containing Cl (chlorine) atoms, the gas containing C (carbon) atoms, and the reducing gas such as $H_2$ gas that are supplied through the first and second gas supply nozzles 60 and 70, SiC epitaxial films can be uniformly formed on the wafers 14 made of a material such as SiC and horizontally positioned in multiple stages.

Figure 8:
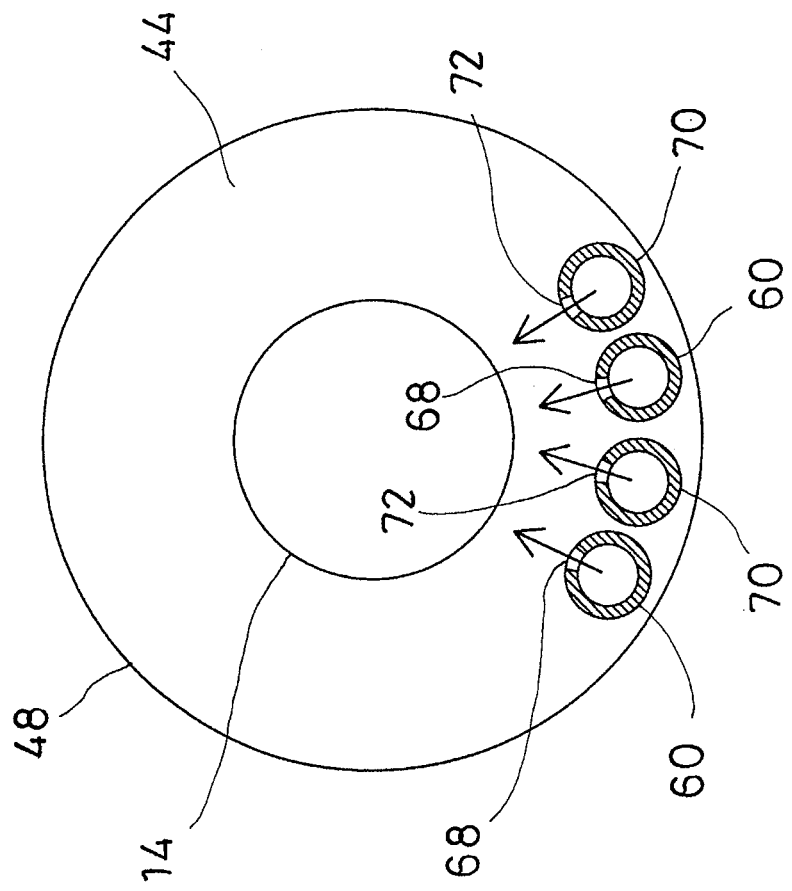
FIG. 8 is a cross-sectional view illustrating a first modification example of the process furnace according to the first embodiment of the present invention.

In addition, preferably, as shown in FIG. 8, a plurality of gas supply nozzles 60 and a plurality of second gas supply nozzles 70 may be installed along the inner circumference of the heating target object 48 disposed in the reaction chamber 44, and first gas supply inlets 68 and second gas supply inlets 72 may be arranged in a manner such that gases can be ejected through the first and second gas supply inlets 68, 72 towards the centers of respective wafers 14. In this case, the first and second gas supply inlets 68, 72 may be uniformly spaced from the wafers 14, and in-surface film thickness uniformity may be further improved.

Figure 9:
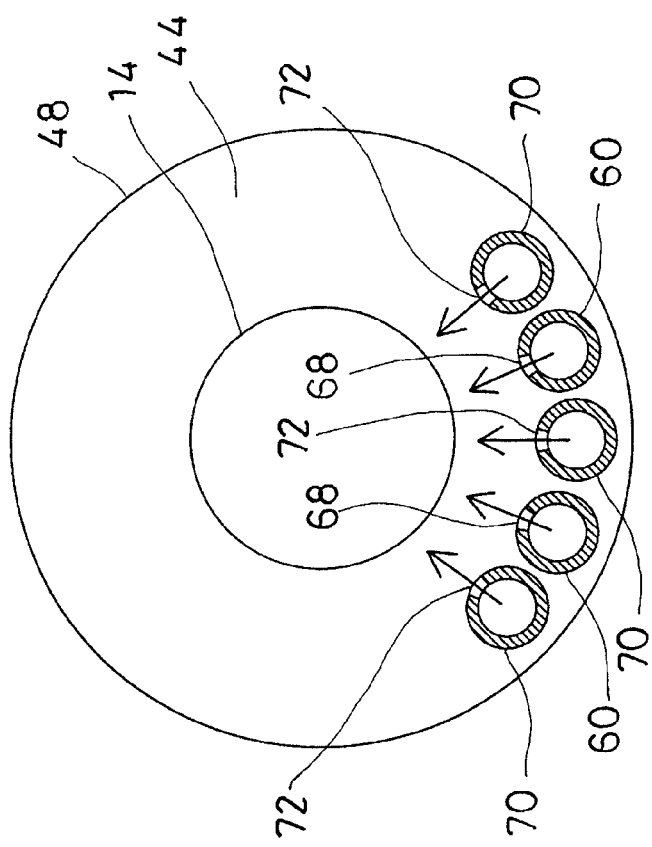
FIG. 9 is a cross-sectional view illustrating a second modification example of the process furnace according to the first embodiment of the present invention.

Furthermore, in the case where a plurality of gas supply nozzles 60 and a plurality of second gas supply nozzles 70 are installed, the structure shown in FIG. 9 may be preferable. That is, in addition to the above-described structure in which the first and second gas supply nozzles 60 and 70 are installed along the inner circumference of the heating target object 48 of the reaction chamber 44, and the first and second gas supply inlets 68, 72 are arranged in a manner such that gases can be ejected through the first and second gas supply inlets 68, 72 towards the centers of respective wafers 14; the second gas supply nozzles 70 may be disposed at both sides. Owing to a reducing gas supplied through the second gas supply inlets 72, film-forming gases can be easily supplied to the wafers 14, and deposition of a Si film or a SiC film on a part other than the wafers 14 can be prevented.

In the above-described structure, the first and second gas supply nozzles 60 and 70 may be alternately arranged. In this case, a film-forming gas supplied through at least the first gas supply inlets 68 and a reducing gas supplied through at least the second gas supply inlets 72 may be mixed with each other at more places, and thus the film-forming gas and the reducing gas may be more efficiently mixed before they reach the wafers 14. Therefore, non-uniform supply of gas can be prevented, and in-surface film thickness uniformity can be further improved.

Although Ar gas (rare gas) is mentioned as an example of inert gas supplied from the gas supply source 210e, the present invention is not limited thereto. For example, He (helium) gas, Ne (neon) gas, Kr (krypton) gas, or Xe (xenon) gas may be used instead of Ar gas.

According to the first embodiment, at least one of the following effects can be attained.

(1) By supplying at least a gas containing Si (silicon) atoms and a gas containing Cl (chlorine) atoms through the first gas supply nozzle 60 and at least a gas containing C (carbon) atoms and a reducing gas through the second gas supply nozzle 70, formation of a deposition film in the gas supply nozzles 60 and 70 can be suppressed.

(2) Owing to the effect (1), consumption of supply gases can be prevented in the gas supply nozzles 60 and 70, and SiC epitaxial films can be uniformly grown through the region from the upstream side to the downstream side of the inside of the reaction chamber 44.

(3) Owing to the effect (1), clogging of the gas supply nozzles 60 and 70 caused by a deposited film can be prevented.

(4) In addition, stripping or separation of a deposited film can be suppressed to prevent an increase of particles in the reaction chamber 44 or adhesion of particles to wafers 14.

(5) Owing to the above-described effects, SiC epitaxial films can be grown on a plurality of substrates by performing a process once in the reaction chamber 44.

Next, a second embodiment of the present invention will be described.

In the first embodiment, the first and second gas supply nozzles 60 and 70 are installed to perform a SiC epitaxial film growing process in the reaction chamber 44 while suppressing growth of a deposition film in the gas supply nozzles 60 and 70. However, in the second embodiment, in order to perform a SiC epitaxial film growing process in the reaction chamber 44 more efficiently, the first and second gas supply nozzles 60 and 70 are modified.

Figure 10:
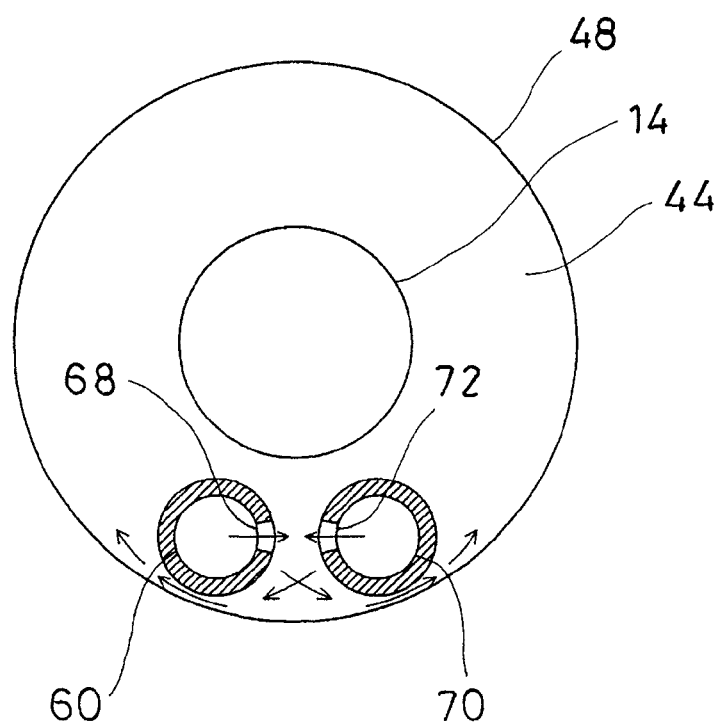
FIG. 10 is a cross-sectional view illustrating a process furnace according to a second embodiment of the present invention.
Figure 11:
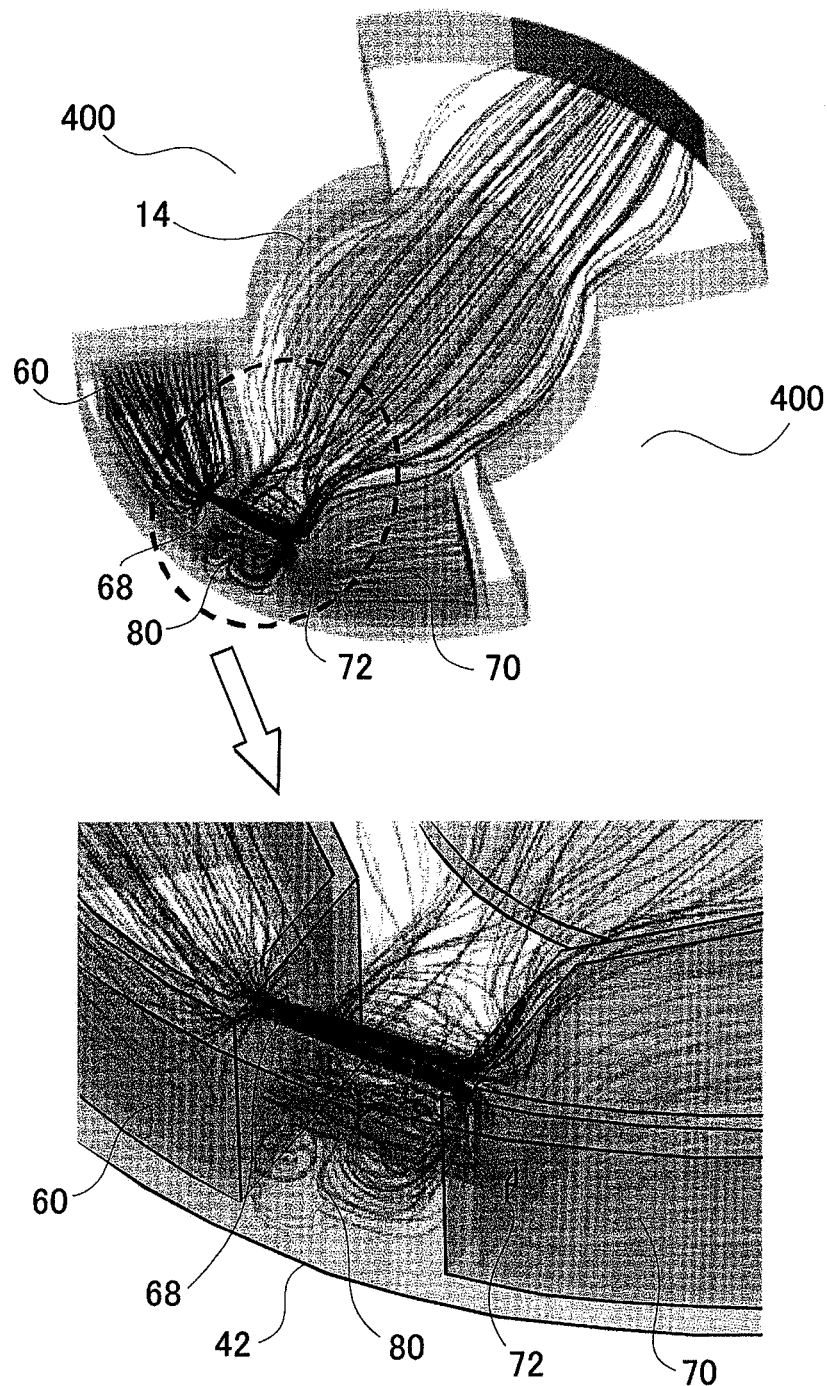
FIG. 11 is a view illustrating flows of gas supplied in a reaction chamber according to the second embodiment of the present invention.

As shown in FIG. 10, the first and second gas supply nozzles 60 and 70 are disposed in the reaction chamber 44 in a manner such that the first and second gas supply inlets 68, 72 face each other. In this case, as shown in FIG. 11, a swirl 80 is formed by gases supplied through the first and second gas supply inlets 68, 72, and owing to the swirl 80, the gases can be sufficiently mixed with each other. Then, the mixed gases can be supplied to wafers 14.

In addition, as shown in FIG. 11, it is preferable that the structures 400 be installed at positions between the heating target object 48 (refer to FIG. 3) and the wafers 14 where the first and second gas supply nozzles 60 and 70 and the first exhaust outlet 90 (refer to FIG. 3) are not disposed. Owing to the structures 400, flow passages of gases supplied through the first and second gas supply inlets 68, 72 can be narrowed to lead the gases to pass on the wafers 14, so that the gases can be supplied to the wafers 14 more efficiently.

Preferably, in a wafer disposition region, the first and second gas supply inlets 68, 72 may be staggered. In this case, a swirl may be generated between the first and second gas supply nozzles 60 and 70, and thus gases may be easily mixed with each other before they reach the wafers 14.

In addition, preferably, in the wafer disposition region, the radial distances of the first and second gas supply inlets 68, 72 from the wafers 14 may be equal but the vertical positions (heights) of the first and second gas supply inlets 68, 72 may be different in the stacked direction of the wafers 14. This prevents the case where gases supplied through the first and second gas supply inlets 68, 72 are not mixed with each other before they reach the wafers 14. That is, a swirl is generated between the first and second gas supply nozzles 60 and 70 so that gases can be supplied to the wafers 14 in a state where the gases are well mixed with each other, and thus a reaction between the gases can occur efficiently on the wafers 14. In addition, a Si film or a SiC film may not be formed on the first and second gas supply inlets 68, 72 or the peripheries of the first and second gas supply inlets 68, 72, and thus clogging of the first and second gas supply nozzles 60 and 70 or generation of particles caused by a deposited film can be prevented.

Figure 12:
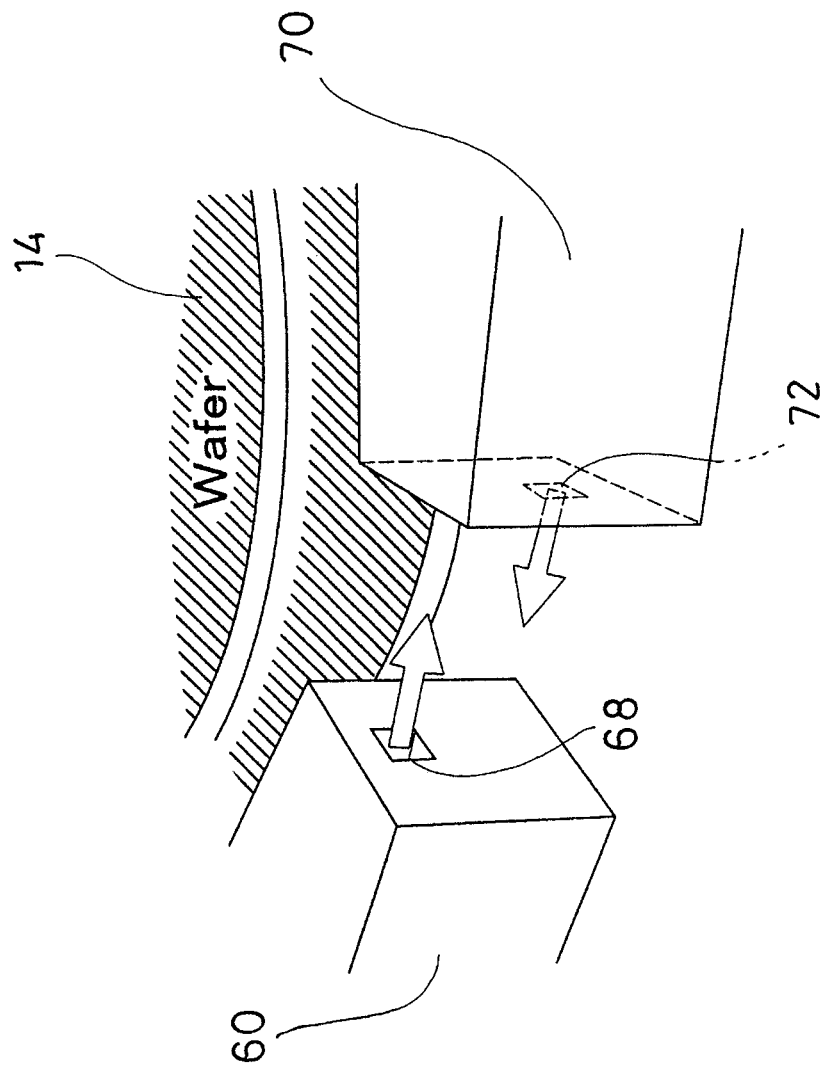
FIG. 12 is an enlarged view illustrating gas supply inlets according to the second embodiment of the present invention.

In addition, as shown in FIG. 12, the position of the first gas supply inlet 68 may be higher than the position of the second gas supply inlet 72, or the position of the second gas supply inlet 72 may be higher than the position of the first gas supply inlet 68.

In addition, two or more first gas supply inlets 68 may be provided, and as many second gas supply inlets 72 as the number of the first gas supply inlets 68 may be provided.

Figure 13:
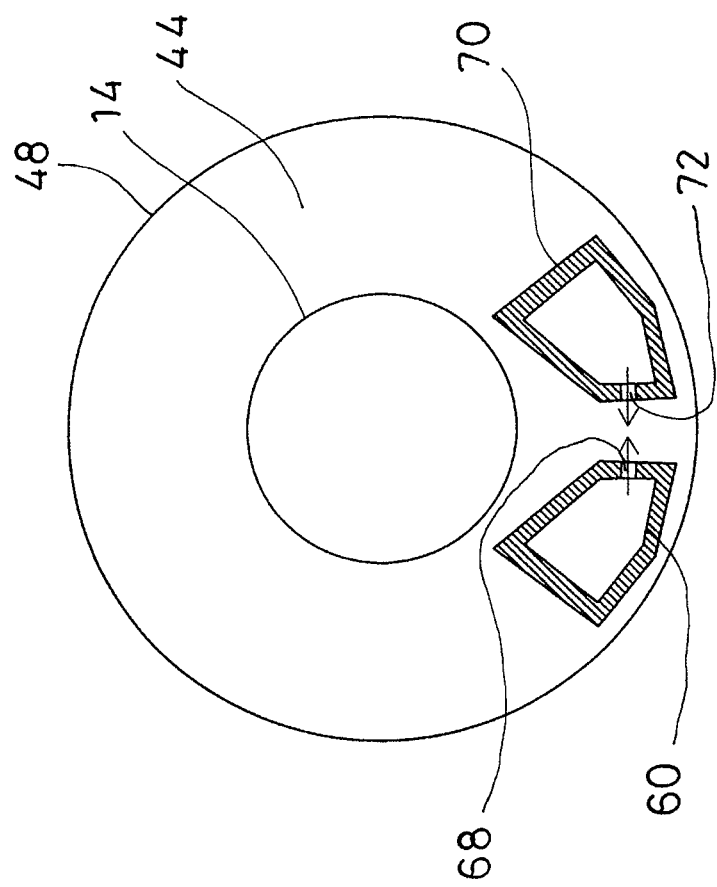
FIG. 13 is a cross-sectional view illustrating a first modification example of the process furnace according to the second embodiment of the present invention.

In addition, although cylindrical gas supply nozzles are shown in FIG. 10, gas supply nozzles having an angled shape such as a polygonal cross-sectional shape may be installed as shown in FIG. 13.

In this case, preferably, sidewalls of the gas supply nozzles having an angled shape such as a polygonal shape may be bent at an obtuse angle or curved such that the sidewalls of the polygonal gas nozzles are disposed along the inner wall of the heating target object 48. In this case, since the space between the polygonal nozzles and the heating target object 48 can be narrowed, film-forming gases can be restrained from flowing into the space to prevent unnecessary consumption of the gases and generation of particles caused by a film formed by the gases introduced into the space, and thus the gases can be supplied to wafers 14 more efficiently.

Furthermore, in the case where the first and second gas supply nozzles 60 and 70 have a polygonal shape, wider gas passages can be formed in the first and second gas supply nozzles 60 and 70, and the inside pressure of the first and second gas supply nozzles 60 and 70 can be reduced.

These can be accomplished not only in the case of polygonal gas supply nozzles but in other cases as long as sidewalls of gas supply nozzles facing the inner wall of the heating target object 48 are bent at an obtuse angle or curved according to the shape of the inner wall of the heating target object 48.

For example, if sidewalls of the first and second gas supply nozzles 60 and 70 facing the inner wall of the heating target object 48 are bent at an obtuse angle or curved according to the shape of the inner wall of the heating target object 48 in the first embodiment shown in FIG. 9, in addition to effects that can be obtained in the first embodiment, more effects can be obtained: that is, formation of an unnecessary film caused by gases introduced into the space between the first and second gas supply nozzles 60 and 70 and the heating target object 48 can be prevented, and generation of particles caused by the unnecessary film can be suppressed.

In addition, if the first and second gas supply nozzles 60 and 70 of FIG. 9 have a polygonal shape, wider gas passages can be formed in the first and second gas supply nozzles 60 and 70, and the inside pressure of the first and second gas supply nozzles 60 and 70 can be reduced.

In FIG. 10, the first and second gas supply inlets 68, 72 are arranged to face each other. The present invention is not limited thereto. For example, the first and second gas supply nozzles 60 and 70 may be disposed in a manner such that the first and second gas supply inlets 68, 72 are angled 45° toward the wafers 14. In this case, gases may be efficiently supplied into the reaction chamber 44 through the first and second gas supply inlets 68, 72, and the flow speed of the gases may be increased.

However, the directions of the first and second gas supply inlets 68, 72 are not limited to the above-mentioned 45-degree angle directions. In the case where the first and second gas supply inlets 68, 72 are angled toward the wafers 14, if mixing of gases is considered, it may be preferable that a cross point of gases supplied through the first and second gas supply inlets 68, 72 be located in front of the centers of the wafers 14. Particularly, it may be more preferable that the cross point of gases be not located on the wafers 14 but in front of the wafers 14, because the gases can be sufficiently mixed with other(s) before the gases reach the wafers 14. In addition, preferably, the first and second gas supply inlets 68, 72 may be inclined at an optimal angle according to the relationship between a mixing efficiency of a gas containing Si (silicon) atoms and a gas containing C (carbon) atoms and the flow speed of the gases.

According to the second embodiment, at least one of the following effects can be attained in addition to the effects explained in the first embodiment.

(1) Since the first and second gas supply nozzles 60 and 70 are installed in a manner such that the first and second gas supply inlets 68, 72 face each other, Si epitaxial films can be formed on wafers 14 in the reaction chamber 44 with an improved in-surface film thickness distribution.

(2) Since the first and second gas supply nozzles 60 and 70 are installed in a manner such that the first and second gas supply inlets 68, 72 are staggered, a swirl can be generated between the first and second gas supply nozzles 60 and 70. Therefore, gases can be easily mixed before the gases reach wafers 14, and thus the gases can be supplied to the wafers 14 in a mixed state. Thus, SiC epitaxial films can be formed on the wafers 14 with improved in-surface film thickness uniformity.

(3) Since the radial distances of the first and second gas supply inlets 68, 72 are equal from the wafers 14 but the vertical positions (heights) of the first and second gas supply inlets 68, 72 are different in the stacked direction of the wafers 14, gases supplied through the first and second gas supply inlets 68, 72 can be prevented from being not mixed with each other before they reach the wafers 14. That is, since a swirl can be generated between the first and second gas supply nozzles 60 and 70, the gases can be supplied to the wafers 14 in a state where the gases are well mixed with each other, and thus SiC epitaxial films can be formed on the wafers 14 with improved in-surface film thickness uniformity.

Next, a third embodiment of the present invention will be described.

In the second embodiment, the first and second gas supply nozzles 60 and 70 are disposed in a manner such that the first and second gas supply inlets 68, 72 face each other, so as to efficiently mix gases supplied into the reaction chamber 44 and then supply the mixed gases to wafers 14 for forming SiC epitaxial films on the wafers 14. In the third embodiment, first and second gas supply nozzles having a modified shape are used to supply gases more efficiently and facilitate growth of SiC epitaxial films.

FIG. 14A and FIG. 14B illustrate an example of the third embodiment. FIG. 14A is a cross-sectional view, and FIG. 14B is a view illustrating an exemplary shape of nozzles. As shown in FIG. 14A and FIG. 14B, branch nozzles 460 are provided on a main nozzle 60*a* of a first gas supply nozzle in a direction toward a main nozzle 70*a* of a second gas supply nozzle. In addition, branch nozzles 470 are provided on the main nozzle 70*a* of the second gas supply nozzle in a direction toward the main nozzle 60*a* of the first gas supply nozzle. At least one gas supply inlet 468 is disposed in each of the branch nozzles 460 in a direction toward wafers 14, and at least one gas supply inlet 472 is disposed in each of the branch nozzles 470 in a direction toward the wafers 14. The branch nozzles 460 and the branch nozzles 470 are arranged in parallel with the wafers 14 which are vertically held in multiple stages. Owing to this configuration, gases can be supplied through the gas supply inlets 468 and 472 in direction parallel with the wafers 14.

In addition, as shown in FIG. 14, preferably, the branch nozzles 460 and 470 may be alternately arranged in the extending direction of the main nozzle 60*a* of the first gas supply nozzle so as to mix gases more sufficiently. However, the present invention is not limited thereto. For example, after every two or more of the branch nozzles 460, the same number of the branch nozzles 470 may be disposed. In this structure, if gases are supplied to the wafers 14, owing to the arrangement of the branch nozzles 460 and 470, in-surface distributions of Si (silicon) and C (carbon) may be less varied. That is, Si (silicon) and C (carbon) may be uniformly distributed to the wafers 14.

Although the gas supply inlets 468 and 472 are arranged to face the wafers 14 in FIG. 14, the gas supply inlets 468 and 472 may be arranged in a different manner. For example, the gas supply inlets 468 may be arranged to face downward, and the gas supply inlets 472 may be arranged to face upward, so as to mix gases before the gases reach the wafers 14. This may facilitate growth of SiC epitaxial films on the wafers 14.

Furthermore, in the above description, the gas supply inlets 468 and 472 are provided in a plurality of positions as shown in FIG. 14. However, alternatively, the gas supply inlets 468 and 472 may be formed into a slit shape. In this case, the initial speed of gases supplied through the gas supply inlets 468 and 472 may be kept low, and a gas containing Si (silicon) atoms and a gas containing C (carbon) atoms may be efficiently mixed with each other after being supplied through the gas supply inlets 68, 72.

In addition, at least one gas supply inlet 468 and at least one gas supply inlet 472 may be formed in the branch nozzles 470, and first and second gas supply inlets 68, 72 may be formed in the main nozzles 60a and 70a of the first and second gas supply nozzles.

Furthermore, in the case where slits are formed in the branch nozzles 460 and 470, the slits may extend to parts of the main nozzles 60a and 70a of the first and second gas supply nozzles.

Figure 15A:
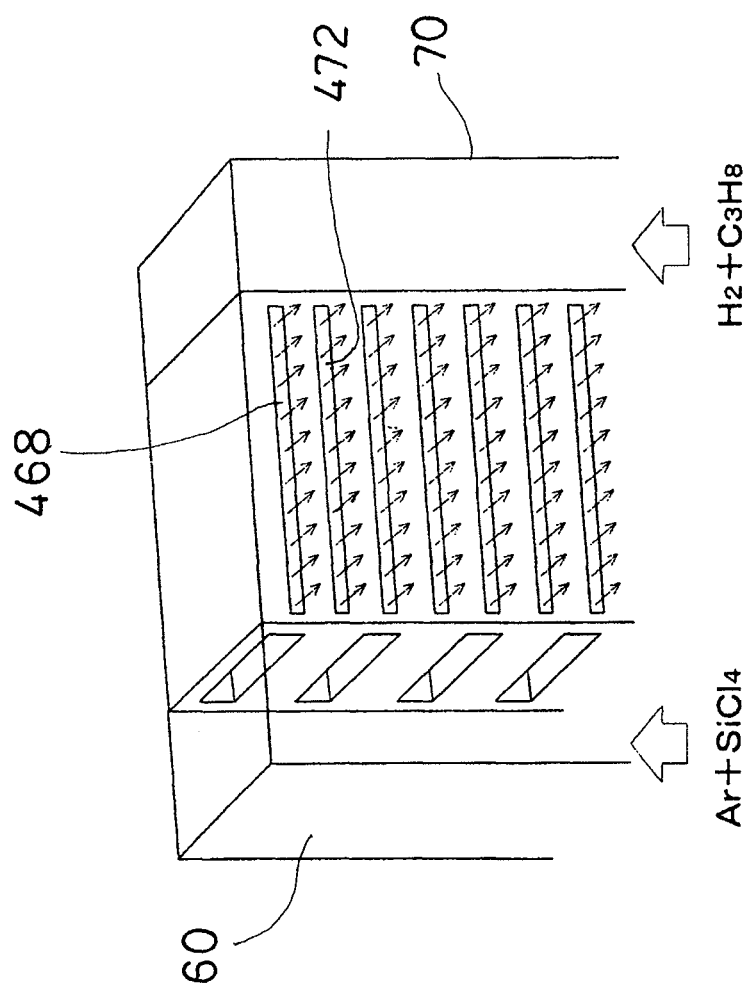
Figure 16:
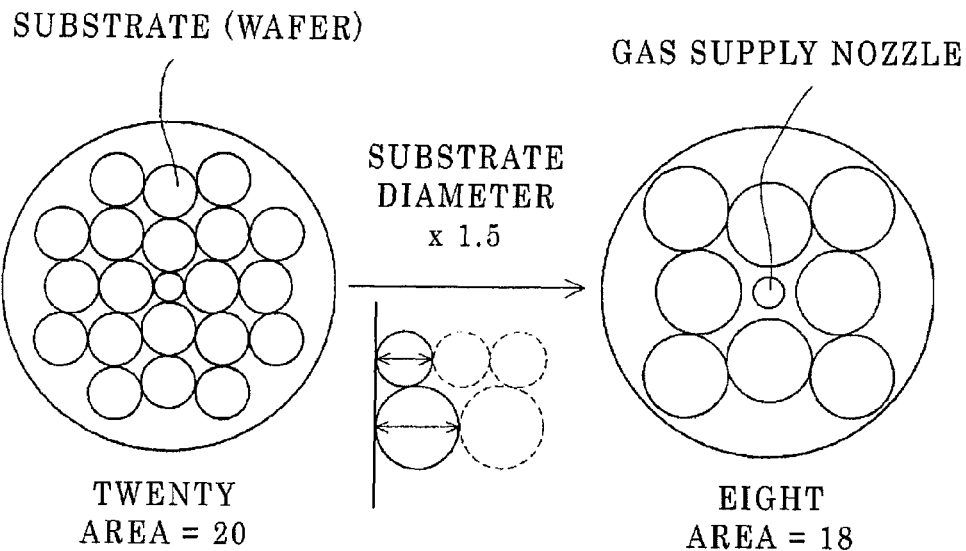
FIG. 16 is a schematic view illustrating a relationship between a pancake type susceptor and substrate positions.

According to a modification example of the third embodiment of the present invention, as shown in FIG. 15A and FIG. 15B, first and second gas supply nozzles 60 and 70 are formed in one piece, and gas supply inlets 468 and 472 are formed in a direction toward stacked wafers 14. In the first and second embodiments, it may be difficult to adjust positions of two or more gas supply nozzles if the gas supply nozzles are disposed closed to each other. However, if the first and second gas supply nozzles 60 and 70 are formed in one piece, the positions of the gas supply inlets 468 and 472 may not varied relative to each other when the first and second gas supply nozzles 60 and 70 are disposed, and thus the positions of the gas supply nozzles 60 and 70 may be easily adjusted.

It is preferable that as many gas supply inlets 468 and 472 as the number of wafers 14 be formed. However, the present invention is not limited thereto. For example, a gas supply inlet 468 and a gas supply inlet 472 may be formed for every several wafers 14.

FIG. 15A and FIG. 15B are views illustrating a modification example of the third embodiment of the present invention. FIG. 15A is a perspective view illustrating gas supply nozzles, and FIG. 15B is a vertical sectional view illustrating the gas supply nozzles. The modified gas supply nozzles shown in FIG. 15A and FIG. 15B are provided by forming the first and second gas supply nozzles 60 and 70 shown in FIG. 14A and FIG. 14B in one piece. For example, the gas supply nozzles have a box shape as shown in FIG. 15A and FIG. 15B, and a barrier wall is disposed in the box shape to form a plurality of gas passages. The barrier wall has a concave-convex comb shape so that a plurality of gas passages can be alternately stacked. Gas supply inlets 468 and 472 are formed in convex parts of the comb shape in a direction toward wafers 14. In FIG. 15A and 15B, the gas supply inlets 468 and 472 are formed in a slit shape. However, the present invention is not limited thereto. For example, instead of a slit-shaped gas supply inlet, one or more hole-shaped gas supply inlets may be formed, or a combination of a slit shape and a hole shape may be used. In the case where the gas supply inlets 468 and 472 are formed into a slit shape, the initial speed of gases supplied through the gas supply inlets 468 and 472 may be kept low, and a gas containing Si (silicon) and a gas containing C (carbon) may be efficiently mixed with each other.

In addition, preferably, in a wafer disposition region, the gas supply inlets 468 and 472 may be spaced the same distance from the wafers 14 in the radial direction of the wafers 14. By this, the film thickness of the wafers 14 may be uniformly kept.

In addition, it may be difficult to adjust the setup positions of the first and second gas supply nozzles 60 and 70 if the first and second gas supply nozzles 60 and 70 have a shape as shown in FIG. 14B. However, if the first and second gas supply nozzles 60 and 70 are formed in one piece as shown in FIG. 15B, the first and second gas supply nozzles 60 and 70 may be easily installed.

According to the above-described third embodiment, formation of a SiC-Poly film on a place other than wafers 14 may be securely suppressed as compared with the case of the second embodiment. Therefore, unnecessary consumption of a source gas caused by formation of a film on a place other than wafers 14 can be prevented, and since gases can flow all over the wafers 14 uniformly and efficiently, the in-surface film thickness distribution of the wafers 14 can be uniform.

According to the third embodiment, at least one of the following effects can be attained in addition to the effects explained in the first and second embodiments.

(1) The branch nozzles 460 and 470 are installed on the first and second gas supply nozzles 60 and 70, and the gas supply inlets 468 and 472 are formed in the branch nozzles 460 and 470, so as to supply gases from multi-layer positions. Therefore, growth of SiC epitaxial films on wafers 14 can be facilitated.

(2) In the case where the first and second gas supply nozzles 60 and 70 are formed in one piece, the first and second gas supply nozzles 60 and 70 may be easily installed, and maintenance works may be easily performed on the first and second gas supply nozzles 60 and 70.

(3) Owing to the effect (2), time necessary for a maintenance work can be reduced, and productivity can be improved.

Although SiC epitaxial growth has been explained, the present invention can be applied to other epitaxial film growth or chemical vapor deposition (CVD) film growth.

Figure 19:
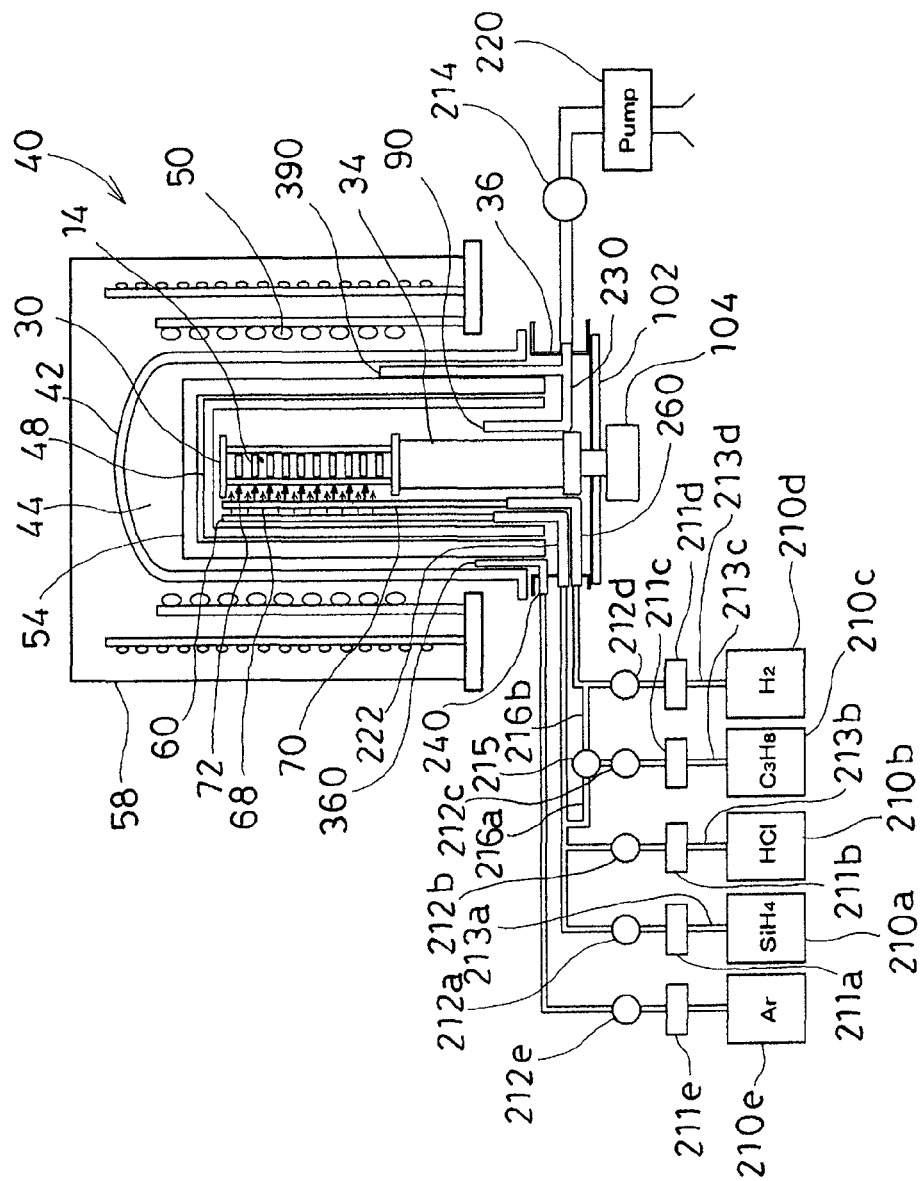
FIG. 19 is a side sectional view illustrating a modification example of the process furnace according to the present invention.

FIG. 19 is a side sectional view illustrating a modification example of the process furnace 40 according to the present invention. In FIG. 19, the same elements as those shown in FIG. 2 are denoted by the same reference numerals, and descriptions thereof will not be repeated.

A first gas supply system is constituted by a gas supply source 210a configured to supply SiH$_4$ gas as a gas containing Si (silicon) atoms; a gas supply source 210b configured to supply HCl gas as a gas containing Cl (chlorine) atoms; valves 212a and 212b; MFCs 211a and 211b; gas pipes 213a and 213b; a first gas line 222; a first gas supply nozzle 60; and at least one gas supply inlet 68 formed in the first gas supply nozzle 60.

A second gas supply system is constituted by a gas supply source 210d configured to H$_2$ gas as a reducing gas; a gas pipe 213d connected to the gas supply source 210d; a valve 212d and an MFC 211d installed at the gas pipe 213d; a second gas line 260 connected to the gas pipe 213d; a second gas supply nozzle 70 connected to the second gas line 260; and a second gas supply inlet 72 formed in the second gas supply nozzle 70. A third gas supply system is constituted by a gas supply source 210c configured to supply C$_3$H$_8$ gas as a gas containing C (carbon) atoms; a gas pipe 213c connected to the gas supply source 210c; a valve 212c and an MFC 211c installed at the gas pipe 213c; a switching valve 215 (described later); and switching pipes 216a and 216b (described later).

An end of the switching pipe 216a is connected to the first gas line 222 constituting the first gas supply system, and the other end of the switching pipe 216a is connected to the gas pipe 213c through the switching valve 215. In addition, an end of the switching pipe 216b is configured to the second gas line 260 constituting the second gas supply system, and the other end of the switching pipe 216b is connected to the gas pipe 213c through the switching valve 215.

The switching valve 215 is used to connect the gas pipe 213c to the first gas line 222 or the second gas line 260 and is connected to the gas flow rate control unit 78 (refer to FIG. 4). The gas flow rate control unit 78 controls the operation of the switching valve 215 so as to connect the third gas supply system to the first gas supply system or the second gas supply system.

When a film forming process is performed on wafers 14 by using the process furnace 40 as described above, if the third gas supply system is connected to the first gas supply system through the switching valve 215, a first gas mixture containing at least $SiH_4$ gas, HCl gas, and $C_3H_8$ gas is supplied into the reaction chamber 44 through the gas supply inlet 68, and a second gas mixture containing at least $H_2$ gas is supplied into the reaction chamber 44 through the second gas supply inlet 72.

If the third gas supply system is connected to the second gas supply system through the switching valve 215, a first gas mixture containing at least $SiH_4$ gas and HCl gas is supplied into the reaction chamber 44 through the gas supply inlet 68, and a second gas mixture containing at least $C_3H_8$ gas and $H_2$ gas is supplied into the reaction chamber 44 through the second gas supply inlet 72.

At this time, a reducing gas such as $H_2$ gas can be supplied into the reaction chamber 44 through a gas supply nozzle different from a gas supply nozzle through which a gas containing Si (silicon) atoms, or a gas containing Si (silicon) atoms and a gas containing C (carbon) atoms are supplied into the reaction chamber 44. This reduces consumption of a first or second gas mixture in the gas supply nozzle caused by a reaction between the first and second gas mixtures. Therefore, deposition of a Si film or a SiC film in the gas supply nozzle caused by a reaction between the first and second gas mixtures can be suppressed, and clogging of a gas supply passage caused by a Si film or SiC film can be suppressed. In addition, generation of particles caused by a Si film or a SiC film can be suppressed.

Furthermore, in the above description, a gas containing Si (silicon) atoms and a gas containing Cl (chlorine) atoms are supplied into the reaction chamber 44. However, alternatively, a gas containing Si (silicon) atoms and Cl (chlorine) atoms, such as $SiCl_4$ (tetrachlorosilane) gas, may be supplied into the reaction chamber 44.

In the above-described structure, if the third gas supply system is connected to the first gas supply system through the switching valve 215, $SiCl_4$ gas and $C_3H_8$ gas may react with each other in the first gas supply nozzle 60; however, this reaction is weak as compared with a reaction between $SiCl_4$ gas and $H_2$ gas (reducing gas). Thus, as compared with the case where a film-forming gas and a reducing gas are supplied into the reaction chamber 44 through the same gas supply nozzle, a SiC film may be less deposited in the first gas supply nozzle 60. Therefore, clogging of the first gas supply nozzle 60 caused by a deposited SiC film can be prevented, and generation of particles caused by a SiC film can be prevented.

In addition, since a first gas mixture containing at least $SiCl_4$ gas and $C_3H_8$ gas is supplied into the reaction chamber 44 through the gas supply inlet 68, the film-forming gases can be mixed with each other in the first gas supply nozzle 60, and Si (silicon) and C (carbon) distributions of a SiC films formed on a wafer 14 can be uniform.

As described above, the present invention provides a substrate processing apparatus, a method of manufacturing a semiconductor device, and a method of manufacturing a substrate, for forming films having a uniform thickness on a plurality of substrates.

(Supplementary Note)

The present invention also includes the following embodiments.

(Supplementary Note 1) According to an embodiment of the present invention, there is provided a substrate processing apparatus comprising: a reaction chamber configured to process a plurality of substrates arranged at predetermined intervals; a heating target object installed in the reaction chamber; a first gas supply system configured to supply at least a gas containing silicon atoms and a gas containing chlorine atoms into the reaction chamber; a second gas supply system configured to supply at least a gas containing carbon atoms and a reducing gas into the reaction chamber; a first gas supply nozzle a part of which is installed in a substrate arranged region between the heating target object and the substrates, the first gas supply nozzle comprising at least one first gas supply inlet disposed in the substrate arranged region; a second gas supply nozzle a part of which is installed in the substrate arranged region between the heating target object and the substrates, the second gas supply nozzle comprising at least one second gas supply inlet disposed in the substrate arranged region; and a controller, wherein the controller is configured to control: the first gas supply system to supply at least the gas containing silicon atoms and the gas containing chlorine atoms into the reaction chamber through the first gas supply inlet; and the second gas supply system to supply at least the gas containing carbon atoms and the reducing gas into the reaction chamber through the second gas supply inlet, so as to so as to form silicon carbide epitaxial films on the substrates.

(Supplementary Note 2) According to another embodiment of the present invention, there is provided a method of manufacturing a semiconductor device, the method comprising: loading a plurality of substrates arranged at predetermined intervals into a reaction chamber; and forming silicon carbide epitaxial films on the substrates by supplying at least a gas containing silicon atoms and a gas containing chlorine atoms into the reaction chamber through one or more first gas supply inlets disposed in a part of a first gas supply nozzle which is installed in the reaction chamber in a substrate arranged region between a heating target object and the substrates, and supplying at least a gas containing carbon atoms and a reducing gas into the reaction chamber through one or more second gas supply inlets disposed in a part of a second gas supply nozzle which is installed in the reaction chamber in the substrate arranged region between the heating target object and the substrates.

(Supplementary Note 3) According to another embodiment of the present invention, there is provided a method of manufacturing a substrate, the method comprising: loading a plurality of substrates arranged at predetermined intervals into a reaction chamber; and forming silicon carbide epitaxial films on the substrates by supplying at least a gas containing silicon atoms and a gas containing chlorine atoms into the reaction chamber through one or more first gas supply inlets disposed in a part of a first gas supply nozzle which is installed in the reaction chamber in a substrate arranged region between a heating target object and the substrates, and supplying at least a gas containing carbon atoms and a reducing gas into the reaction chamber through one or more second gas supply inlets disposed in a part of a second gas supply nozzle which is installed in the reaction chamber in the substrate arranged region between the heating target object and the substrates.

(Supplementary Note 4) In the substrate processing apparatus of Supplementary Note 1, the reducing gas may further be supplied through the first gas supply inlet.

(Supplementary Note 5) In the substrate processing apparatus of Supplementary Note 1, the first and second gas supply nozzles may have a cylindrical shape.

(Supplementary Note 6) In the substrate processing apparatus of Supplementary Note 1, the first and second gas supply nozzles may have a polygonal shape.

(Supplementary Note 7) In the substrate processing apparatus of Supplementary Note 5 or 6, the first and second gas supply nozzles may have a shape curved according to an inner wall of the heating target object.

(Supplementary Note 8) In the substrate processing apparatus of Supplementary Note 1, the first gas supply inlet may be disposed in a direction toward the second gas supply nozzle, and the second gas supply inlet may be disposed in a direction toward the first gas supply nozzle.

(Supplementary Note 9) In the substrate processing apparatus of Supplementary Note 8, the first and second gas supply inlets may be disposed at positions facing each other.

(Supplementary Note 10) In the substrate processing apparatus of Supplementary Note 8 or 9, the first and second gas supply inlets may be staggered.

(Supplementary Note 11) In the substrate processing apparatus of Supplementary Note 8 or 9, the first and second gas supply inlets may be spaced the same distance from a wafer in radial directions of the wafer, and the first and second gas supply inlets may be disposed at different positions (heights) in a direction perpendicular to the wafer.

(Supplementary Note 12) In the substrate processing apparatus of Supplementary Note 1, each of the first and second gas supply nozzles may comprise at least one branch nozzle, and the branch nozzle may comprise at least one gas supply inlet.

(Supplementary Note 13) In the substrate processing apparatus of Supplementary Note 12, the branch nozzles of the first and second gas supply nozzles may be alternately arranged in a vertical direction.

(Supplementary Note 14) In the substrate processing apparatus of Supplementary Note 12, the branch nozzle may be parallel with a wafer.

(Supplementary Note 15) In the substrate processing apparatus of Supplementary Note 12, the gas supply inlet of the branch nozzle may be parallel with a wafer.

(Supplementary Note 16) In the substrate processing apparatus of Supplementary Note 12, the branch nozzle may comprise a slit parallel with a wafer.

(Supplementary Note 17) The substrate processing apparatus of Supplementary Note 1 may further comprise a magnetic field generating unit installed outside the reaction chamber for electromagnetic induction heating.

(Supplementary Note 18) In the substrate processing apparatus of Supplementary Note 1, an insulator may be installed between a reaction tube constituting the reaction chamber and a heating target object.

(Supplementary Note 19) According to another embodiment of the present invention, there is provided a substrate processing apparatus comprising: a reaction chamber configured to process a plurality of substrates stacked at predetermined intervals; a first gas supply system configured to supply at least a film-forming gas; a second gas supply system configured to supply at least a reducing gas; an even number of first gas supply nozzles connected to the first gas supply system and extending in a stacked direction of the substrates, each of the first gas supply nozzles comprising at least one first gas supply inlet in a stacked region of the substrates; an odd number of second gas supply nozzles connected to the second gas supply system and extending in the stacked direction of the substrates, each of the second gas supply nozzles comprising at least one second gas supply inlet in the stacked region of the substrates; and a controller configured to control the first gas supply system to supply at least the film-forming gas through the first gas supply inlet and control the second gas supply system to supply at least the reducing gas, so as to form predetermined films on the substrates, wherein the second gas supply nozzles are disposed at both sides.

(Supplementary Note 20) In the substrate processing apparatus of Supplementary Note 19, the first and second gas supply nozzles may be arranged in a circumferential direction of the substrates.

(Supplementary Note 21) In the substrate processing apparatus of Supplementary Note 19 or 20, the first and second gas supply nozzles may be alternately arranged.

(Supplementary Note 22) In the substrate processing apparatus of Supplementary Note 19 or 21, the first and second gas supply nozzles may be arranged along an inner wall of the reaction chamber, and at least outer sides of the first and second gas supply nozzles facing the inner wall of the reaction chamber may be bent at an obtuse angle or may be curved.

(Supplementary Note 23) In the substrate processing apparatus of Supplementary Note 22, the first and second gas supply nozzles may have a polygonal shape.

(Supplementary Note 24) According to another embodiment of the present invention, there is provided a substrate processing apparatus comprising: a first gas supply system configured to supply at least a film-forming gas; a second gas supply system configured to supply at least a reducing gas; a first gas supply nozzle connected to the first gas supply system and extending in a stacked direction of the substrates, the first gas supply nozzle comprising at least one first gas supply inlet in a stacked region of the substrates; a second gas supply nozzle connected to the second gas supply system and extending in the stacked direction of the substrates, the second gas supply nozzle comprising at least one second gas supply inlet in the stacked region of the substrates; and a controller configured to control the first gas supply system to supply at least the film-forming gas through the first gas supply inlet and control the second gas supply system to supply at least the reducing gas, so as to form predetermined films on the substrates, wherein the first gas supply inlet of the first gas supply nozzle is disposed to face the second gas supply nozzle, and the second gas supply inlet of the second gas supply nozzle is disposed to face the first gas supply nozzle.

(Supplementary Note 25) In the substrate processing apparatus of Supplementary Note 24, the first and second gas supply inlets may be disposed at different heights.

(Supplementary Note 26) In the substrate processing apparatus of Supplementary Note 23 or 24, the first and second gas supply nozzles may be arranged along an inner wall of the reaction chamber, and at least outer sides of the first and second gas supply nozzles facing the inner wall of the reaction chamber may be bent at an obtuse angle or may be curved.

(Supplementary Note 27) In the substrate processing apparatus of Supplementary Note 26, the first and second gas supply nozzles may have a polygonal shape.

(Supplementary Note 28) According to another embodiment of the present invention, there is provided a substrate processing apparatus comprising: a reaction chamber configured to process a plurality of substrates stacked at predetermined intervals; a first gas supply system configured to supply at least a film-forming gas; a second gas supply system configured to supply at least a reducing gas; a first gas supply nozzle connected to the first gas supply system and extending in a stacked direction of the substrates; a second gas supply nozzle connected to the second gas supply system and extending in the stacked direction of the substrates; a first branch nozzle installed on the first gas supply nozzle and extending toward the second gas supply nozzle in a direction parallel with main surfaces of the substrates; a first gas supply inlet formed in at least one position of the first branch nozzle; a second branch nozzle installed on the second gas supply nozzle and extending toward the first gas supply nozzle in a direction parallel with the main surfaces of the substrates; a second gas supply inlet formed in at least one position of the second branch nozzle; and a controller configured to control the first gas supply system to supply at least the film-forming gas through the first gas supply inlet and control the second gas supply system to supply at least the reducing gas, so as to form predetermined films on the substrates, wherein the first and second gas supply inlets are close to each other in the stacked direction of the substrates.

(Supplementary Note 29) In the substrate processing apparatus of Supplementary Note 28, the first and second gas supply inlets may be alternately arranged at positions close to each other in the stacked direction of the substrates.

(Supplementary Note 30) In the substrate processing apparatus of Supplementary Note 28 or 29, the first and second gas supply inlets may be parallel with the main surfaces of the substrates.

(Supplementary Note 31) In the substrate processing apparatus of Supplementary Note 1, inert gas may be further supplied through the first gas supply inlet, and the supply amount of the inert gas may be 1/10 or greater than the supply amount of the reducing gas.

(Supplementary Note 32) In the substrate processing apparatus of Supplementary Note 31, the supply amount of the inert gas may be 1/2 or smaller than the supply amount of the reducing gas.

(Supplementary Note 33) In the substrate processing apparatus of Supplementary Note 1, the first and second gas supply inlets may be formed in predetermined directions that cross at a point which is closer to the first and second gas supply inlets than to the centers of the substrates. (Supplementary Note 34) In the substrate processing apparatus of Supplementary Note 33, the first and second gas supply inlets may be formed in predetermined directions that cross at a point which is closer to the first and second gas supply inlets than to the edges of the substrates.

(Supplementary Note 35) The substrate processing apparatus of Supplementary Note 1 may further comprise a switching valve for selectively supplying the gas containing carbon atoms from the second gas supply system to the first gas supply nozzle or the second gas supply nozzle, wherein the controller may control the switching valve to selectively supply the gas containing carbon atoms to the first gas supply nozzle or the second gas supply nozzle.

What is claimed is:

1. A substrate processing apparatus comprising:
a reaction chamber configured to process a plurality of substrates stacked at predetermined intervals;
a magnetic field generating unit installed outside the reaction tube and generating a magnetic field;
a heating target object installed between the reaction tube and the magnetic field generating unit, the heating target object being configured to heat an inside of the reaction chamber by the magnetic field generated by the magnetic field generating unit;
a first gas supply system configured to supply at least a gas containing silicon atoms and a gas containing chlorine atoms, or a gas containing silicon atoms and chlorine atoms;
a second gas supply system configured to supply at least a reducing gas;
a third gas supply system configured to supply at least a gas containing carbon atoms;
a first gas supply nozzle connected to the first gas supply system and extending within the reaction chamber in a stacked direction of the plurality of substrates, the first gas supply nozzle comprising one or more first gas supply inlets in a region where the plurality of substrates are stacked;
a second gas supply nozzle connected to the second and third gas supply systems and extending within the reaction chamber in the stacked direction, the second gas supply nozzle comprising one or more second gas supply inlets in the region where the plurality of substrates are stacked; and
a controller configured to control:
the first gas supply system to supply at least the gas containing silicon atoms and the gas containing chlorine atoms, or at least the gas containing silicon atoms and chlorine atoms into the reaction chamber through the first gas supply inlets of the first gas supply nozzle;
the second gas supply system to supply at least the reducing gas into the reaction chamber through the second gas supply inlets of the second gas supply nozzle; and
the third gas supply system so as to supply at least the gas containing carbon atoms into the reaction chamber through the second gas supply inlets of the second gas supply nozzle,
so as to form silicon carbide films on the substrates.

2. The substrate processing apparatus of claim 1, wherein the reducing gas is further supplied through the first gas supply inlet.

3. The substrate processing apparatus of claim 1, wherein each of the first and second gas supply nozzles has a cylindrical shape.

4. The substrate processing apparatus of claim 1, wherein each of the first and second gas supply nozzles has a polygonal shape.

5. The substrate processing apparatus of claim 4, wherein each of the first and second gas supply nozzles has a shape curved according to an inner wall of the heating target object.

6. The substrate processing apparatus of claim 1, wherein the first gas supply inlet is disposed in a direction toward the second gas supply nozzle, and the second gas supply inlet is disposed in a direction toward the first gas supply nozzle.

7. The substrate processing apparatus of claim 6, wherein the first and second gas supply inlets face each other.

8. The substrate processing apparatus of claim 6, wherein the first and second gas supply inlets are staggered.

9. The substrate processing apparatus of claim 6, wherein the first and second gas supply inlets are spaced a same distance from the substrates in a radial direction of each of the plurality of substrates, and the first and second gas supply inlets are disposed at different heights in the stacking direction of the plurality of substrates.

10. The substrate processing apparatus of claim 1, wherein each of the first and second gas supply nozzles comprises at least one branch nozzle, and each of the at least one branch nozzle comprises at least one gas supply inlet.

11. The substrate processing apparatus of claim 10, wherein the at least one branch nozzle of each of the first and second gas supply nozzles are alternately arranged in a vertical direction.

12. The substrate processing apparatus of claim 11, wherein each of the at least one branch nozzle is parallel to each of the plurality of substrates.

13. The substrate processing apparatus of claim 11, wherein the at least one gas supply inlets of each of the at least one branch nozzle are parallel to one of the plurality of substrates.

14. The substrate processing apparatus of claim 11, wherein each of the at least one branch nozzle comprises a slit parallel to one of the plurality of substrates.

15. The substrate processing apparatus of claim 1, wherein an inert gas is further supplied through the first gas supply inlet, and an amount of the inert gas supplied through the first gas supply inlet is $1/10$ or greater than an amount of the reducing gas supplied into the process chamber.

16. The substrate processing apparatus of claim 1, wherein an inert gas is further supplied through the first gas supply inlet, and an amount of the inert gas is $1/2$ or smaller than an amount of the reducing gas.

17. The substrate processing apparatus of claim 1, wherein the first and second gas supply inlets are disposed in directions that cross at a point closer to the first and second gas supply inlets than to a center of each of the plurality of substrates.

18. The substrate processing apparatus of claim 17, wherein the first and second gas supply inlets are disposed in the directions that cross at the point closer to the first and second gas supply inlets than to an edge of each of the plurality of substrates.

19. A method of manufacturing a semiconductor device, the method comprising:

loading a plurality of substrates stacked at predetermined intervals into a reaction chamber;

heating an inside of the reaction chamber by a heating target object installed between the reaction tube and a magnetic field generating unit with a magnetic field generated by the magnetic field generating unit installed outside the reaction tube;

forming silicon carbide films on the plurality of substrates by supplying at least a gas containing silicon atoms and a gas containing chlorine atoms, or at least a gas containing silicon atoms and chlorine atoms into the reaction chamber through one or more first gas supply inlets of a first gas supply nozzle extending within the reaction chamber in a stacked direction of the plurality of substrates, the one or more first gas supply inlets being disposed in a region where the plurality of substrates are stacked, and supplying at least a reducing gas and a gas containing carbon atoms into the reaction chamber through one or more second gas supply inlets of a second gas supply nozzle extending within the reaction chamber in the stacked direction, the one or more second gas supply inlets being disposed in the region where the plurality of substrates are stacked; and unloading the plurality of substrates from the reaction chamber.

20. A method of manufacturing a substrate, the method comprising:

loading a plurality of substrates stacked at predetermined intervals into a reaction chamber;

heating an inside of the reaction chamber by a heating target object installed between the reaction tube and a magnetic field generating unit with a magnetic field generated by the magnetic field generating unit installed outside the reaction tube;

forming silicon carbide films on the plurality of substrates by supplying at least a gas containing silicon atoms and a gas containing chlorine atoms, or at least a gas containing silicon atoms and chlorine atoms into the reaction chamber through one or more first gas supply inlets of a first gas supply nozzle extending within the reaction chamber in a stacked direction of the plurality of substrates, the one or more first gas supply inlets being disposed in a region where the plurality of substrates are stacked, and supplying at least a reducing gas and a gas containing carbon atoms into the reaction chamber through one or more second gas supply inlets of a second gas supply nozzle extending within the reaction chamber in the stacked direction, the one or more second gas supply inlets being disposed in the region where the plurality of substrates are stacked; and unloading the plurality of substrates from the reaction chamber.

* * * * *